(12) United States Patent
Koezuka et al.

(10) Patent No.: US 8,709,922 B2
(45) Date of Patent: Apr. 29, 2014

(54) SEMICONDUCTOR DEVICE

(75) Inventors: Junichi Koezuka, Tochigi (JP); Naoto Yamade, Isehara (JP); Kyoko Yoshioka, Atsugi (JP); Yuhei Sato, Atsugi (JP); Mari Terashima, Ayase (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/448,611

(22) Filed: Apr. 17, 2012

(65) Prior Publication Data

US 2012/0280234 A1 Nov. 8, 2012

(30) Foreign Application Priority Data

May 6, 2011 (JP) .................................. 2011-103592

(51) Int. Cl.
*H01L 29/786* (2006.01)
*H01L 29/66* (2006.01)

(52) U.S. Cl.
USPC .... 438/482; 438/483; 438/104; 257/E21.411; 257/E21.09

(58) Field of Classification Search
CPC ................... H01L 29/78693; H01L 29/68606; H01L 29/66742
USPC .............. 257/43, 57; 438/285, 158, 483, 479, 438/471, 480, 482, 473, 505–510
See application file for complete search history.

(56) References Cited

U.S. PATENT DOCUMENTS 5,731,856 A 3/1998 Kim et al.
5,744,864 A 4/1998 Cillessen et al.
6,294,274 B1 9/2001 Kawazoe et al.
6,563,174 B2 5/2003 Kawasaki et al.
6,727,522 B1 4/2004 Kawasaki et al.
7,049,190 B2 5/2006 Takeda et al.

(Continued)

FOREIGN PATENT DOCUMENTS

EP 1737044 A 12/2006
EP 2226847 A 9/2010

(Continued)

OTHER PUBLICATIONS

Li et al., Observation of dynamic annealing effects in oxide single crystals after high-dose O+ implantation at 500 C, 1998, Physical Review B vol. 57, No. 10, 5668-5673.*

(Continued)

*Primary Examiner* — Julia Slutsker
*Assistant Examiner* — Natalia Gondarenko
(74) *Attorney, Agent, or Firm* — Eric J. Robinson; Robinson Intellectual Property Law Office, P.C.

(57) ABSTRACT

A highly reliable semiconductor device which is formed using an oxide semiconductor and has stable electric characteristics is provided. A semiconductor device which includes an amorphous oxide semiconductor layer including a region containing oxygen in a proportion higher than that in the stoichiometric composition, and an aluminum oxide film provided over the amorphous oxide semiconductor layer is provided. The amorphous oxide semiconductor layer is formed as follows: oxygen implantation treatment is performed on a crystalline or amorphous oxide semiconductor layer which has been subjected to dehydration or dehydrogenation treatment, and then thermal treatment is performed on the oxide semiconductor layer provided with an aluminum oxide film at a temperature lower than or equal to 450° C.

11 Claims, 19 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,642,573 B2 | 1/2010 | Hoffman et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,838,348 B2 | 11/2010 | Hoffman et al. | |
| 7,994,500 B2 | 8/2011 | Kim et al. | |
| 8,058,645 B2 | 11/2011 | Jeong et al. | |
| 8,093,136 B2 | 1/2012 | Endo et al. | |
| 8,129,719 B2 | 3/2012 | Yamazaki et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0157413 A1* | 8/2004 | Miyairi et al. | 438/479 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108177 A1* | 5/2008 | Hoffman et al. | 438/104 |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142887 A1 | 6/2009 | Son et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0321731 A1 | 12/2009 | Jeong et al. | |
| 2010/0051938 A1* | 3/2010 | Hayashi et al. | 257/43 |
| 2010/0051949 A1* | 3/2010 | Yamazaki et al. | 257/57 |
| 2010/0065844 A1 | 3/2010 | Tokunaga | |
| 2010/0090217 A1 | 4/2010 | Akimoto | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0213460 A1* | 8/2010 | Kondo et al. | 257/43 |
| 2010/0295041 A1 | 11/2010 | Kumomi et al. | |
| 2010/0301329 A1* | 12/2010 | Asano et al. | 257/43 |
| 2010/0320458 A1 | 12/2010 | Umeda et al. | |
| 2010/0320459 A1 | 12/2010 | Umeda et al. | |
| 2011/0008930 A1* | 1/2011 | Sasaki et al. | 438/104 |
| 2011/0086475 A1* | 4/2011 | Yamazaki et al. | 438/162 |
| 2011/0193083 A1 | 8/2011 | Kim et al. | |
| 2011/0212569 A1 | 9/2011 | Yamazaki et al. | |
| 2011/0215328 A1 | 9/2011 | Morosawa et al. | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0281394 A1 | 11/2011 | Yamazaki | |
| 2012/0001170 A1 | 1/2012 | Yamazaki | |
| 2012/0119205 A1 | 5/2012 | Taniguchi et al. | |
| 2012/0122277 A1 | 5/2012 | Yamazaki et al. | |
| 2012/0231580 A1 | 9/2012 | Yamazaki et al. | |
| 2012/0276694 A1 | 11/2012 | Koezuka et al. | |
| 2012/0295397 A1 | 11/2012 | Koezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2006-165528 A | 6/2006 |
| JP | 2007-073698 A | 3/2007 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2012-160679 | 8/2012 |
| WO | WO-2004/114391 | 12/2004 |
| WO | WO-2008/133345 | 11/2008 |

OTHER PUBLICATIONS

STIC Search Report, 2013, STIC Database Tracking No. 425686, by searcher Scott Segal STIC-EIC2800.*

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 2621006-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m= 3, 4, and 5), InGaO3(ZnO)3, and Ga2O3(ZnO)m (M= 7, 8, 9, and 16) in the In2O3—ZnGa2O4—ZnO Systems,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of The 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions of Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] At Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

* cited by examiner

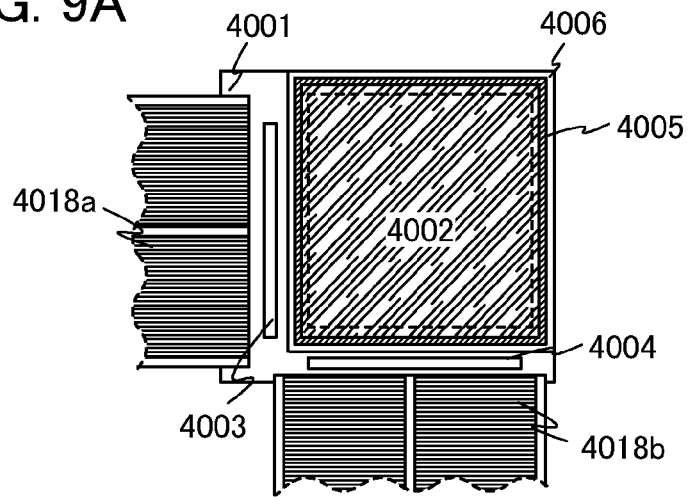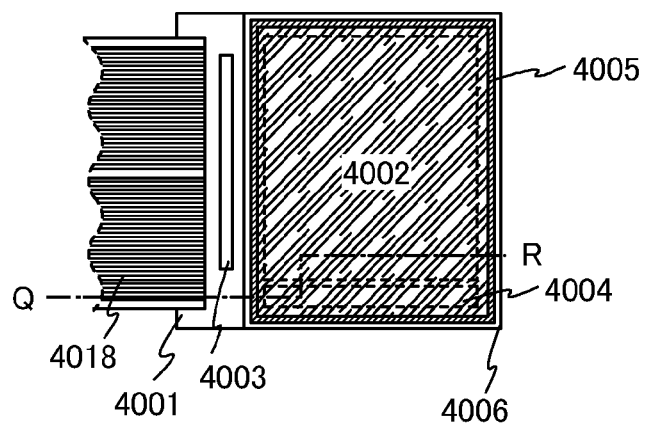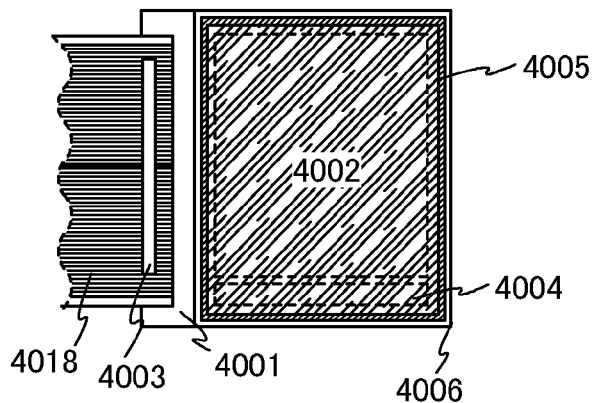

FIG. 15A1
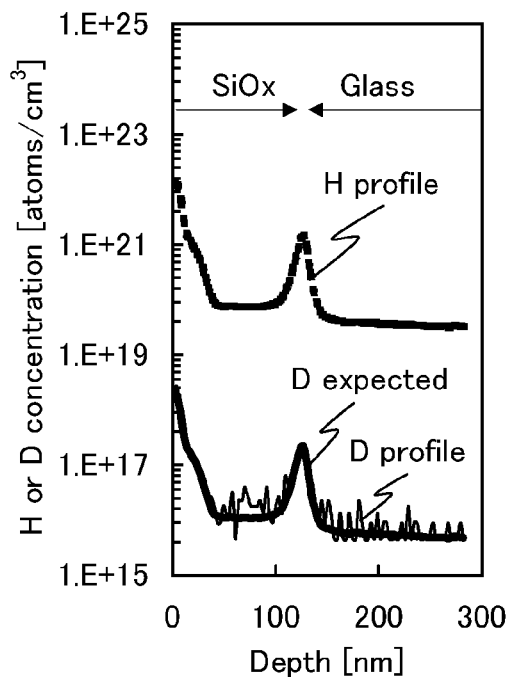
FIG. 15A2
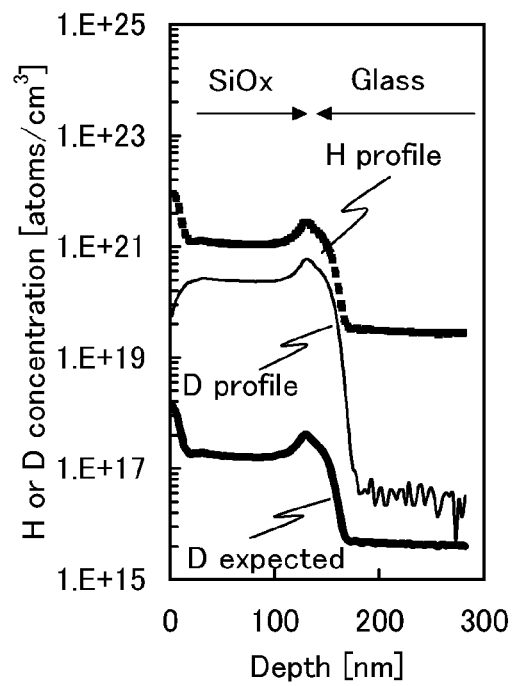
FIG. 15B1
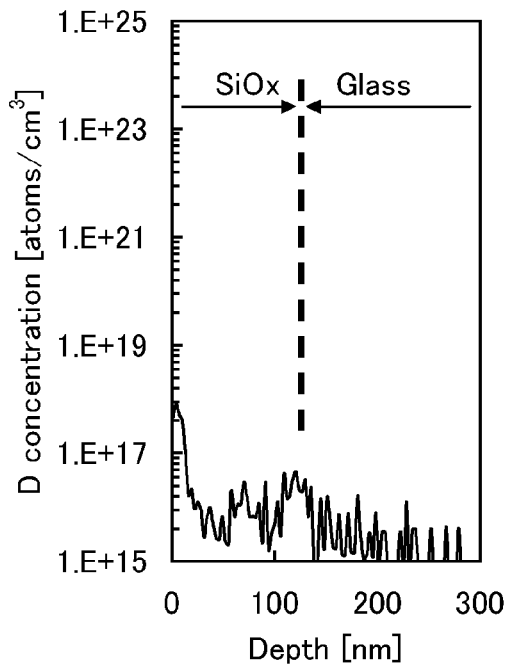
FIG. 15B2
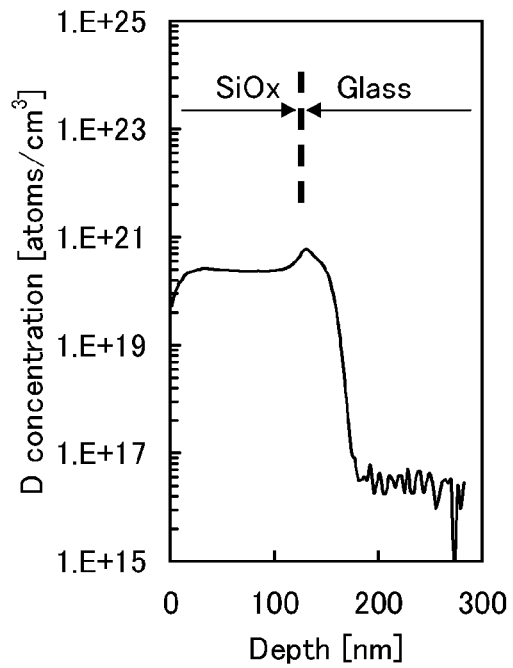

FIG. 16A1
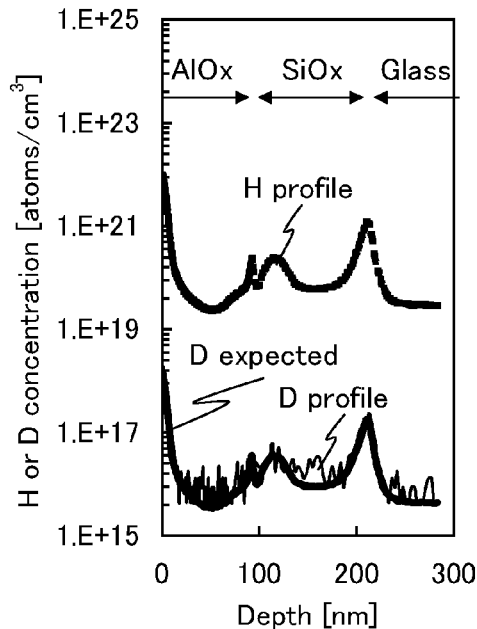
FIG. 16A2
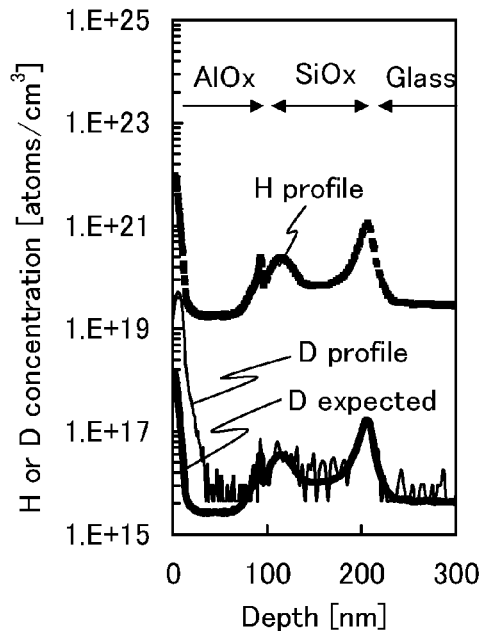
FIG. 16B1
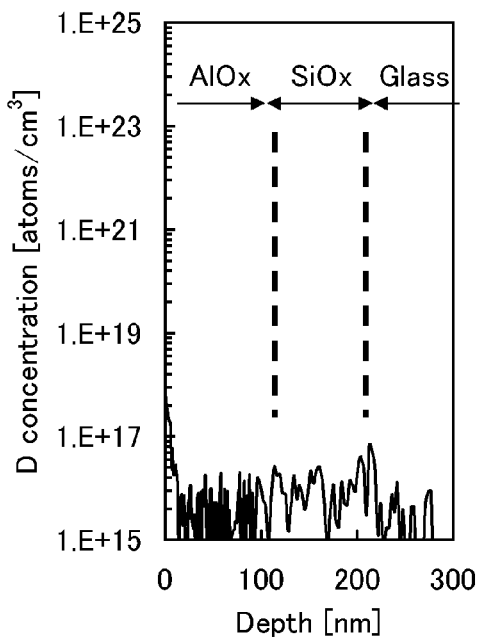
FIG. 16B2
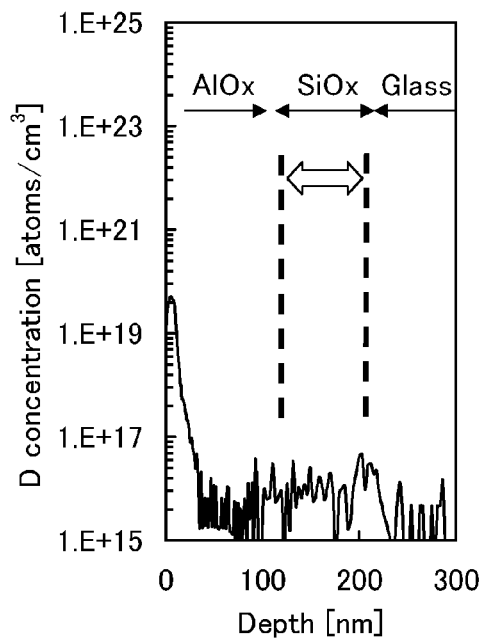

SEMICONDUCTOR DEVICE

BACKGROUND OF THE INVENTION

1. Field of the Invention

The present invention relates to a semiconductor device and a method of manufacturing the semiconductor device.

It is to be noted that the semiconductor device in this specification refers to all devices that can function by utilizing semiconductor characteristics, and electro-optic devices, semiconductor circuits, and electronic appliances are all semiconductor devices.

2. Description of the Related Art

Attention has been focused on a technique for forming a transistor (also referred to as a thin film transistor (TFT)) with the use of a semiconductor thin film formed over a substrate having an insulating surface. Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor material has been attracting attention.

For example, a transistor whose active layer is formed using an amorphous oxide containing indium (In), gallium (Ga), and zinc (Zn) and having an electron carrier concentration lower than $10^{18}/cm^3$ is disclosed (see Patent Document 1).

REFERENCE

Patent Document

[Patent Document 1] Japanese Published Patent Application No. 2006-165528

SUMMARY OF THE INVENTION

However, the electric conductivity of a semiconductor device including an oxide semiconductor changes when hydrogen or moisture forming an electron donor contaminates the oxide semiconductor in a process of forming a thin film of the oxide semiconductor. The electric conductivity might also change when the formed oxide semiconductor thin film includes an oxygen vacancy. Such a phenomenon causes variation in the electric characteristics of a transistor formed using the oxide semiconductor.

In view of the above problem, an object is to provide a highly reliable semiconductor device which is formed using an oxide semiconductor and has stable electric characteristics.

A semiconductor device according to one embodiment of the invention disclosed herein includes an amorphous oxide semiconductor layer including a region containing oxygen in a proportion higher than that in the stoichiometric composition (that is, stoichiometrically excessive oxygen), and an aluminum oxide film provided over the amorphous oxide semiconductor layer. The amorphous oxide semiconductor layer is formed as follows: oxygen implantation treatment is performed on a crystalline or amorphous oxide semiconductor layer which has been subjected to dehydration or dehydrogenation treatment, and then thermal treatment is performed on the oxide semiconductor layer provided with an aluminum oxide film at a temperature which allows the amorphous state to be maintained. The temperature of the thermal treatment is lower than or equal to 450° C. Specifically, the following structure can be employed for example.

One embodiment of the present invention is a semiconductor device which includes an amorphous oxide semiconductor layer including a region containing oxygen in a proportion higher than that in a stoichiometric composition, a source electrode and a drain electrode that are electrically connected to the amorphous oxide semiconductor layer, a gate electrode overlapping with the amorphous oxide semiconductor layer, a gate insulating layer provided between the amorphous oxide semiconductor layer and the gate electrode, and an aluminum oxide film provided over the amorphous oxide semiconductor layer.

Another embodiment of the present invention is a semiconductor device which includes an amorphous oxide semiconductor layer including a region containing oxygen in a proportion higher than that in a stoichiometric composition, a source electrode and a drain electrode that are electrically connected to the amorphous oxide semiconductor layer, a gate insulating layer provided over the amorphous oxide semiconductor layer so as to cover the source electrode and the drain electrode, a gate electrode provided over the gate insulating layer so as to overlap with the amorphous oxide semiconductor layer, and an aluminum oxide film provided over and in contact with the gate electrode.

Another embodiment of the present invention is a semiconductor device which includes a gate electrode, a gate insulating layer provided over the gate electrode, an amorphous oxide semiconductor layer that is provided over the gate insulating layer so as to overlap with the gate electrode and includes a region containing oxygen in a proportion higher than that in a stoichiometric composition, a source electrode and a drain electrode that are electrically connected to the amorphous oxide semiconductor layer, and an aluminum oxide film provided over the amorphous oxide semiconductor layer so as to be in contact with at least part of the amorphous oxide semiconductor layer.

In any one of the above semiconductor devices, the gate insulating layer preferably includes a region containing oxygen in a proportion higher than that in a stoichiometric composition.

In any one of the above semiconductor devices, it is preferable that an oxide insulating film be further provided between the aluminum oxide film and the amorphous oxide semiconductor layer and that the oxide insulating film include a region containing oxygen in a proportion higher than that in a stoichiometric composition.

Note that the term "over" in this specification and the like does not necessarily mean that a component is placed "directly on" another component. For example, the expression "a gate electrode over a gate insulating layer" does not exclude the case where a component is placed between the gate insulating layer and the gate electrode. The same applies to the term "below".

In this specification and the like, the term "electrode" or "wiring" does not limit the function of a component. For example, an "electrode" is sometimes used as part of a "wiring", and vice versa. In addition, the term "electrode" or "wiring" can also mean a combination of a plurality of "electrodes" or "wirings", for example.

Oxygen implantation is performed so that excess oxygen is contained in an amorphous oxide semiconductor layer, and thermal treatment is performed in a state where an aluminum oxide film is provided over the amorphous oxide semiconductor layer in order to prevent the oxygen in the amorphous oxide semiconductor layer from being released, whereby it is possible to prevent generation or increase of defects in the amorphous oxide semiconductor and at interfaces between the amorphous oxide semiconductor and layers which are over/under and in contact with the amorphous oxide semiconductor. That is, the excess oxygen contained in the amorphous oxide semiconductor layer acts to fill an oxygen-vacancy defect, so that a highly reliable semiconductor device having stable electric characteristics can be provided.

BRIEF DESCRIPTION OF THE DRAWINGS

In the accompanying drawings:

FIGS. 9A to 9C each illustrate one embodiment of a semiconductor device;

FIGS. 15A1, 15A2, 15B1, and 15B2 show results of SIMS measurement performed on a sample fabricated in Example 1;

FIGS. 16A1, 16A2, 16B1, and 16B2 show results of SIMS measurement performed on a sample fabricated in Example 1;

DETAILED DESCRIPTION OF THE INVENTION

Hereinafter, embodiments and examples of the invention disclosed in this specification will be described in detail with reference to the accompanying drawings. Note that the invention disclosed in this specification is not limited to the following description, and it is easily understood by those skilled in the art that modes and details of the invention can be modified in various ways. Therefore, the invention disclosed in this specification is not limited to the description of the following embodiments and examples.

Note that the ordinal numbers such as "first" and "second" in this specification and the like are used for convenience and do not denote the order of steps or the stacking order of layers.

In addition, the ordinal numbers in this specification and the like do not denote particular names which specify the invention.

Embodiment 1

In this embodiment, one embodiment of a semiconductor device and one embodiment of a method of manufacturing the semiconductor device will be described with reference to FIGS. 1A to 1C, FIGS. 2A to 2C, and FIGS. 3A to 3D.

Figure 1A:
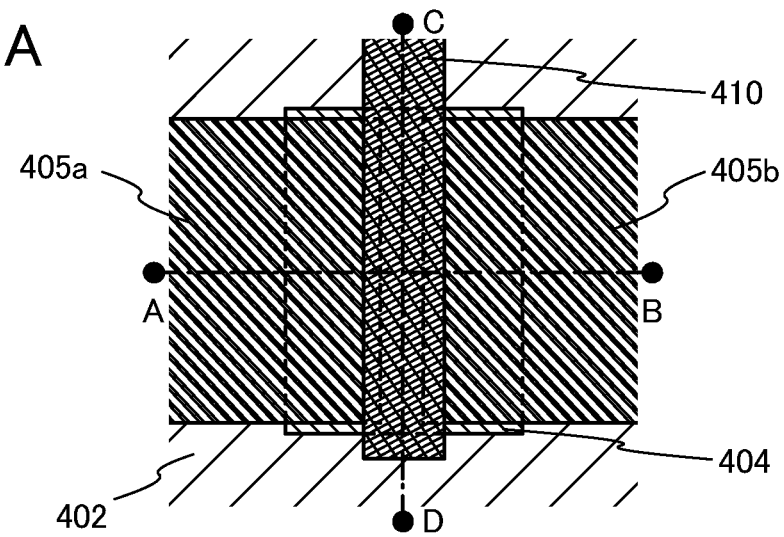
FIGS. 1A to 1C are a plan view and cross-sectional views which illustrate one embodiment of a semiconductor device.
Figure 1B:
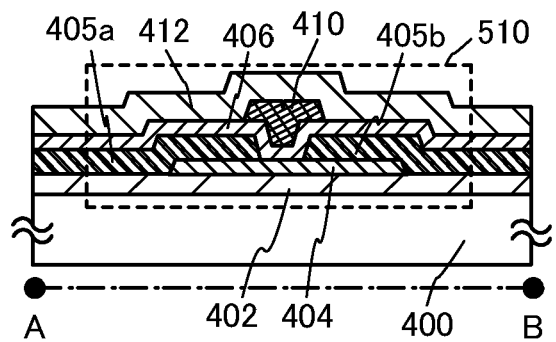
Figure 1C:
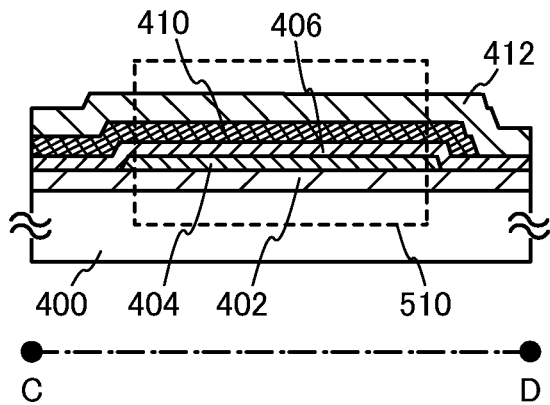

FIGS. 1A to 1C are a plan view and cross-sectional views which illustrate a top-gate transistor 510 as an example of a semiconductor device. FIG. 1A is a plan view of the transistor 510, and FIGS. 1B and 1C are cross-sectional views along line A-B and line C-D in FIG. 1A, respectively. Note that in FIG. 1A, some components of the transistor 510 (e.g., a gate insulating layer 406) are not illustrated for brevity.

The transistor 510 illustrated in FIGS. 1A to 1C includes, over a substrate 400 having an insulating surface, a base insulating layer 402, an amorphous oxide semiconductor layer 404, a source electrode 405a, a drain electrode 405b, the gate insulating layer 406, a gate electrode 410, and an insulating layer 412.

In the transistor 510 illustrated in FIGS. 1A to 1C, the amorphous oxide semiconductor layer 404 includes a region containing oxygen in a proportion higher than that in the stoichiometric composition (hereinafter also referred to as an oxygen-excess region). In general, oxygen, which is one of main components of the amorphous oxide semiconductor layer 404, dynamically repeats bonding to and dissociation from metal elements that are other main components in the layer. A metal element from which oxygen is dissociated has a dangling bond; therefore, it is supposed that a certain number of oxygen vacancies caused by dissociation of oxygen exist in the amorphous oxide semiconductor layer. In the transistor according to one embodiment of the present invention, however, excess oxygen contained in the amorphous oxide semiconductor layer 404 can immediately compensate a defect (oxygen defect) due to an oxygen vacancy in the amorphous oxide semiconductor layer 404. Consequently, a highly reliable semiconductor device having stable electric characteristics can be provided.

The amorphous oxide semiconductor layer 404 has an amorphous structure in whole.

In the transistor 510, a layer including an aluminum oxide film is provided as the insulating layer 412. Since aluminum oxide has a barrier property and thus is less likely to transmit hydrogen, moisture, oxygen, and another impurity, entry of an impurity such as moisture from the outside after completion of the device can be prevented. Note that the insulating layer 412 includes at least an aluminum oxide film and may have a stacked structure including the aluminum oxide film and a film containing another inorganic insulating material. In the case where the insulating layer 412 has a stacked structure including the aluminum oxide film and a film containing another inorganic insulating material, it is preferable that the film containing another inorganic insulating material be positioned on the amorphous oxide semiconductor layer 404 side and be an oxide insulating film including an oxygen-excess region. For example, the insulating layer 412 can have a structure in which a silicon oxide film including an oxygen-excess region and the aluminum oxide film are stacked in this order from the amorphous oxide semiconductor layer 404 side.

It is preferable that the gate insulating layer 406 include an oxygen-excess region for the following reason. When the gate insulating layer 406 includes an oxygen-excess region, oxygen can be prevented from moving from the amorphous oxide semiconductor layer 404 to the gate insulating layer 406, and oxygen can be supplied from the gate insulating layer 406 to the amorphous oxide semiconductor layer 404. It is preferable that the base insulating layer 402 also include an oxygen-excess region.

An insulating layer may be further provided over the transistor 510. Further, an opening may be formed in the gate insulating layer 406 or the like in order that the source electrode 405a or the drain electrode 405b may be electrically connected to a wiring. Note that the amorphous oxide semiconductor layer 404 is not necessarily processed into an island shape.

Figure 2A:
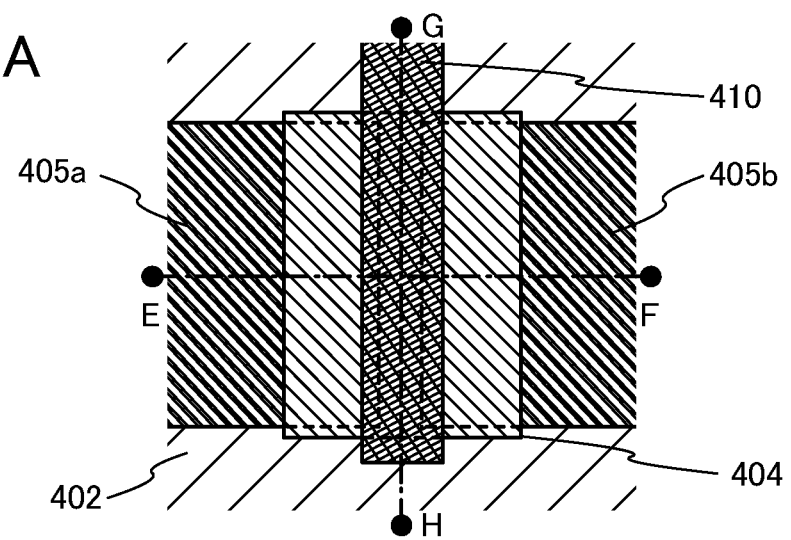
FIGS. 2A to 2C are a plan view and cross-sectional views which illustrate one embodiment of a semiconductor device.
Figure 2B:
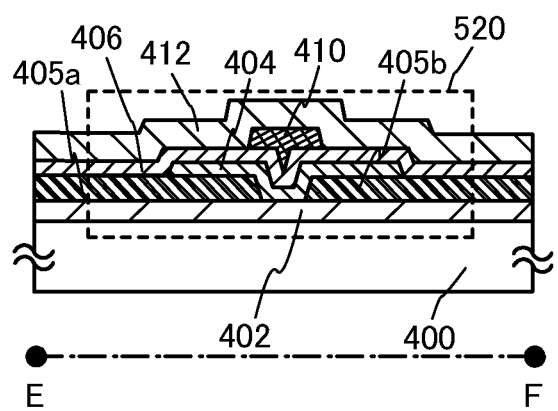
Figure 2C:
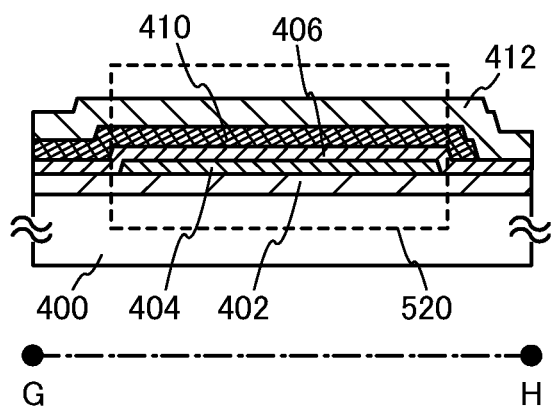

FIGS. 2A to 2C illustrate another structure example of a transistor according to this embodiment. FIG. 2A is a plan view of a transistor 520, and FIGS. 2B and 2C are cross-sectional views along line E-F and line G-H in FIG. 2A, respectively. Note that in FIG. 2A, some components of the transistor 520 (e.g., the gate insulating layer 406) are omitted for brevity.

As in the case of the transistor 510 illustrated in FIGS. 1A to 1C, the transistor 520 illustrated in FIGS. 2A to 2C includes, over the substrate 400 having an insulating surface, the base insulating layer 402, the amorphous oxide semiconductor layer 404, the source electrode 405a, the drain electrode 405b, the gate insulating layer 406, the gate electrode 410, and the insulating layer 412.

A difference between the transistor 520 illustrated in FIGS. 2A to 2C and the transistor 510 illustrated in FIGS. 1A to 1C is the stacking order of the source and drain electrodes 405a and 405b and the amorphous oxide semiconductor layer 404. That is, the transistor 520 includes the source electrode 405a and the drain electrode 405b which are in contact with the base insulating layer 402, and the amorphous oxide semiconductor layer 404 provided over the source electrode 405a and the drain electrode 405b. The other components are similar to those of the transistor 510, and thus the description of the transistor 510 can be referred to for the details.

An example of a manufacturing process of the transistor 510 will be described below with reference to FIGS. 3A to 3D. Note that the transistor 520 can be manufactured in a process similar to that of the transistor 510 except for the stacking order of the source and drain electrodes 405a and 405b and the amorphous oxide semiconductor layer 404.

First, the base insulating layer 402 is formed over the substrate 400 having an insulating surface. There is no particular limitation on a substrate that can be used as the substrate 400 having an insulating surface as long as it has heat resistance high enough to withstand thermal treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, any of these substrates over which a semiconductor element is provided may be used as the substrate 400.

A flexible substrate may be used as the substrate 400. In the case of using a flexible substrate, a transistor including an oxide semiconductor film may be directly formed over the flexible substrate, or a transistor including an oxide semiconductor film may be formed over a different manufacturing substrate and then separated to be transferred to the flexible substrate. Note that in order to separate the transistor from the manufacturing substrate and transfer it to the flexible substrate, a separation layer may be provided between the manufacturing substrate and the transistor including the oxide semiconductor film.

The base insulating layer 402 can have a single-layer or stacked structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials. When the base insulating layer 402 is formed as a stacked structure including an oxide insulating film, it is preferred that the oxide insulating film be in contact with the amorphous oxide semiconductor layer 404 formed later. In this embodiment, a silicon oxide film is formed as the base insulating layer 402 by a plasma CVD method, a sputtering method, or the like.

Further, the base insulating layer 402 preferably includes an oxygen-excess region because an oxygen vacancy in the amorphous oxide semiconductor layer 404 can be compensated by excess oxygen contained in the base insulating layer 402. In the case of having a stacked structure, the base insulating layer 402 preferably includes an oxygen-excess region at least in a layer in contact with the amorphous oxide semiconductor layer 404. In order to provide the oxygen-excess region in the base insulating layer 402, for example, the base insulating layer 402 may be formed in an oxygen atmosphere. Alternatively, the oxygen-excess region may be formed by implanting oxygen (including at least one of an oxygen radical, an oxygen atom, and an oxygen ion) into the base insulating layer 402 after its formation. Oxygen can be implanted by an ion implantation method, an ion doping method, a plasma immersion ion implantation method, plasma treatment, or the like.

Figure 3A:
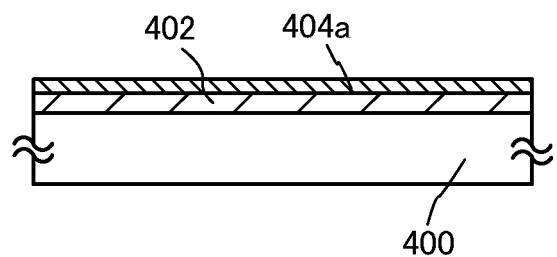
FIGS. 3A to 3D are cross-sectional views which illustrate one embodiment of a method of manufacturing a semiconductor device.

Next, over the base insulating layer 402, an amorphous oxide semiconductor layer 404a having a thickness greater than or equal to 2 nm and less than or equal to 200 nm, preferably greater than or equal to 5 nm and less than or equal to 30 nm, is formed (see FIG. 3A).

A metal oxide material containing two or more kinds selected from In, Ga, Zn, and Sn may be used as an oxide semiconductor material. For example, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, or a Hf—In—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; or a Zn—O-based material may be used. In addition, any of the above oxide semiconductors may contain an element other than In, Ga, Sn, and Zn, for example, $SiO_2$.

Here, for example, an In—Ga—Zn—O-based oxide semiconductor means an oxide semiconductor containing indium (In), gallium (Ga), and zinc (Zn) and there is no particular limitation on the composition ratio thereof.

In addition, as the amorphous oxide semiconductor layer 404a, a thin film of a material represented by the chemical formula, $InMO_3(ZnO)_m$ (m>0), can be used. Here, M represents one or more metal elements selected from Zn, Ga, Al, Mn, and Co. For example, M can be Ga, Ga and Al, Ga and Mn, or Ga and Co.

In the case where an In—Sn—Zn—O-based material is used as an oxide semiconductor, a target to be used may have a composition ratio of In:Sn:Zn=1:2:2, In:Sn:Zn=2:1:3, In:Sn:Zn=1:1:1, or the like in an atomic ratio.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z≥1.5X+Y is satisfied.

The amorphous oxide semiconductor layer 404a is preferably formed by a sputtering method. In addition, in the formation of the amorphous oxide semiconductor layer 404a by a sputtering method, the concentration of hydrogen contained in the amorphous oxide semiconductor layer 404a is preferably reduced as much as possible. In order to reduce the hydrogen concentration, a high-purity rare gas (typically argon), high-purity oxygen, or a high-purity mixed gas of a rare gas and oxygen, from which impurities such as hydrogen, water, a compound having a hydroxyl group, and a hydride are removed, is supplied into a treatment chamber of a sputtering apparatus as an atmosphere gas, as appropriate. Evacuation of the treatment chamber is preferably performed using a cryopump having a high capability in evacuating water or a sputter ion pump having a high capability in evacuating hydrogen.

It is preferable that the base insulating layer 402 and the amorphous oxide semiconductor layer 404a be successively formed without exposure to the air. For example, the following steps may be performed: impurities containing hydrogen attached to a surface of the substrate 400 are removed by thermal treatment or plasma treatment, and then the base insulating layer 402 and the amorphous oxide semiconductor layer 404a are successively formed in this order without exposure to the air. In this manner, impurities containing hydrogen attached to a surface of the base insulating layer 402 can be reduced and an atmospheric component can be prevented from being attached to an interface between the substrate 400 and the base insulating layer 402 and an interface between the base insulating layer 402 and the amorphous oxide semiconductor layer 404a. As a result, it is possible to manufacture the transistor 510 having favorable electric characteristics and high reliability.

Note that before the amorphous oxide semiconductor layer 404a is formed by a sputtering method, powder substances (also referred to as particles or dust) which are attached to the surface of the base insulating layer 402 are preferably removed by reverse sputtering in which an argon gas is introduced and plasma is generated. The reverse sputtering is a method in which voltage is applied to a substrate side, not to a target side, in an argon atmosphere by using an RF power source and plasma is generated in the vicinity of the substrate to modify a surface. Note that instead of an argon atmosphere, a nitrogen atmosphere, a helium atmosphere, an oxygen atmosphere, or the like may be used.

Next, thermal treatment (first thermal treatment) is performed on the amorphous oxide semiconductor layer 404a in order to remove hydrogen (including water and a hydroxyl group) (dehydration or dehydrogenation). The thermal treatment is performed at a temperature at which the amorphous oxide semiconductor layer 404a is not crystallized, typically, higher than or equal to 250° C. and lower than or equal to 450° C., preferably lower than or equal to 300° C.

Hydrogen, which is an n-type impurity, can be removed from the oxide semiconductor by the thermal treatment; thus, the oxide semiconductor can be highly purified so as to contain as few impurities as possible. For example, the concentration of hydrogen contained in the amorphous oxide semiconductor layer 404a after the dehydration or dehydrogenation treatment can be lower than or equal to $5\times10^{19}/cm^3$ or lower than or equal to $5\times10^{18}/cm^3$.

Note that the thermal treatment for dehydration or dehydrogenation is preferably performed before the amorphous oxide semiconductor layer 404a is processed into an island shape because oxygen contained in the base insulating layer 402 can be prevented from being released by the thermal treatment.

Further, it is preferable that in the thermal treatment, water, hydrogen, and the like be not contained in nitrogen or a rare gas such as helium, neon, or argon. The purity of nitrogen or a rare gas such as helium, neon, or argon which is introduced into a thermal treatment apparatus is preferably higher than or equal to 6N (99.9999%), further preferably higher than or equal to 7N (99.99999%) (that is, the impurity concentration is preferably lower than or equal to 1 ppm, further preferably lower than or equal to 0.1 ppm).

Next, the amorphous oxide semiconductor layer 404a is processed into the island-shaped amorphous oxide semiconductor layer 404 in a photolithography step. Note that a resist mask for forming the island-shaped amorphous oxide semiconductor layer 404 may be formed by an inkjet method. Formation of the resist mask by an inkjet method needs no photomask; thus, the manufacturing cost of the semiconductor device can be reduced.

Figure 3B:
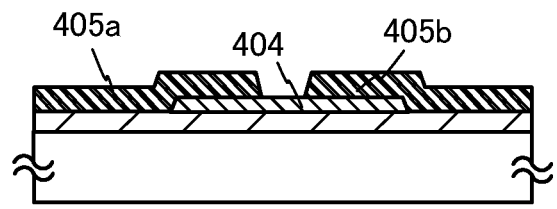

Next, a conductive film which is to be a source electrode and a drain electrode (including a wiring formed in the same layer as the source electrode and the drain electrode) is formed over the amorphous oxide semiconductor layer 404 and is processed, so that the source electrode 405a and the drain electrode 405b are formed (see FIG. 3B).

The conductive film used for the source electrode 405a and the drain electrode 405b is formed using a material that can withstand a thermal treatment step performed later. For example, a metal film containing an element selected from Al, Cr, Cu, Ta, Ti, Mo, and W, or a metal nitride film containing any of these elements as a component (titanium nitride film, molybdenum nitride film, or tungsten nitride film) can be used. Alternatively, a film of a high-melting-point metal such as Ti, Mo, or W or a metal nitride film of any of these elements (titanium nitride film, molybdenum nitride film, or tungsten nitride film) may be stacked on one or both of a bottom side and a top side of a metal film of Al, Cu, or the like. Further alternatively, the conductive film used for the source electrode and the drain electrode may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Note that it is preferable that etching conditions be optimized so that the amorphous oxide semiconductor layer 404 is not etched and divided when the conductive film is etched. However, it is difficult to obtain conditions under which only the conductive film is etched and the amorphous oxide semiconductor layer 404 is not etched at all. For that reason, in some cases, part of the amorphous oxide semiconductor layer 404 is etched to be an amorphous oxide semiconductor layer having a groove (depressed portion) when the conductive film is etched.

Next, the gate insulating layer 406 which covers the source electrode 405a and the drain electrode 405b and is in contact with part of the amorphous oxide semiconductor layer 404 is formed.

The gate insulating layer 406 is preferably formed by a plasma CVD method or a sputtering method, and can be formed as a silicon oxide film, a gallium oxide film, an aluminum oxide film, a silicon nitride film, a silicon oxynitride film, an aluminum oxynitride film, a silicon nitride oxide film, or the like. Alternatively, as a material for the gate insulating layer 406, a high-k material such as hafnium oxide, yttrium oxide, lanthanum oxide, hafnium silicate (HfSi$_x$O$_y$ (x>0, y>0)), hafnium aluminate (HfAl$_x$O$_y$ (x>0, y>0)), hafnium silicate to which nitrogen is added, or hafnium aluminate to which nitrogen is added may be used. Use of such a high-k material enables a reduction in gate leakage current. Note that the gate insulating layer 406 may have either a single-layer structure or a stacked structure.

Note that the gate insulating layer 406 preferably includes an oxygen-excess region because an oxygen vacancy in the amorphous oxide semiconductor layer 404 can be compensated by excess oxygen contained in the gate insulating layer 406.

Figure 3C:
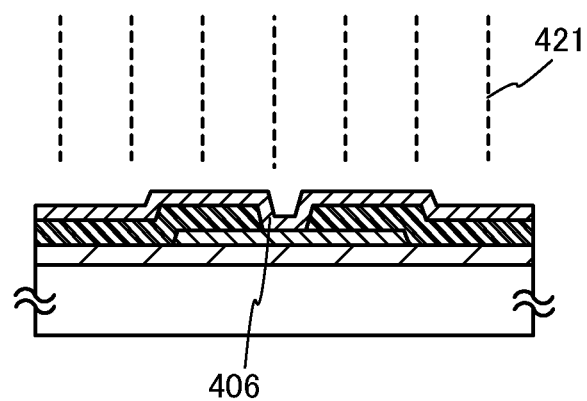

Next, oxygen 421 is implanted into the amorphous oxide semiconductor layer 404 from above the gate insulating layer 406, so that an oxygen-excess region is formed (see FIG. 3C). By the implantation treatment of the oxygen 421, oxygen in the amorphous oxide semiconductor layer 404, which is decreased in concentration through the above thermal treatment for dehydration or dehydrogenation, can be supplied. Thus, the amorphous oxide semiconductor layer 404 can be highly purified and become an electrically i-type (intrinsic) semiconductor. Further, formation of the oxygen-excess region in the amorphous oxide semiconductor layer 404 enables an oxygen vacancy to be compensated. Thus, charge trapping centers in the amorphous oxide semiconductor layer 404 can be reduced.

As a method of implanting the oxygen 421, a method by which the oxygen 421 can be implanted into the inside or an interface of the amorphous oxide semiconductor layer 404 is employed. For example, an ion implantation method or an ion doping method can be used. In an ion implantation method, a source gas is made into plasma, ion species included in this plasma are extracted and mass-separated, and ion species with predetermined mass are accelerated and implanted into an object to be processed as an ion beam. In an ion doping method, a source gas is made into plasma, ion species are extracted from the plasma by application of a predetermined electric field, and the extracted ion species are accelerated without mass separation and implanted into an object to be processed as an ion beam. When the implantation of the oxygen 421 is performed by an ion implantation method involving mass separation, an impurity such as a metal element can be prevented from being added, together with the oxygen 421, to the amorphous oxide semiconductor layer 404. On the other hand, an ion doping method enables ion-beam irradiation to a larger area than an ion implantation method; therefore, when the implantation of the oxygen 421 is performed by an ion doping method, the takt time can be shortened.

Alternatively, as a method of implanting the oxygen 421, a plasma immersion ion implantation method may be used. By a plasma immersion ion implantation method, the oxygen 421 can be implanted efficiently even when the amorphous oxide semiconductor layer 404 has an uneven shape.

In this embodiment, an example is shown in which the oxygen 421 is implanted into the amorphous oxide semiconductor layer 404 through the gate insulating layer 406. Implantation of the oxygen 421 into the amorphous oxide semiconductor layer 404 through a film stacked over the amorphous oxide semiconductor layer 404 is advantageous in that the depth at which the oxygen is implanted (implantation region) can be controlled more easily, so that the oxygen 421 can be efficiently implanted into the amorphous oxide semiconductor layer 404. Note that an embodiment of the present invention is not limited to this manner; it is also possible to perform the implantation in a state where a surface of the amorphous oxide semiconductor layer 404 is exposed (i.e., before the conductive film which is to be the source electrode 405a and the drain electrode 405b is formed) or after the insulating layer 412 is formed.

The depth at which the oxygen 421 is implanted may be controlled by appropriately setting an implantation condition such as acceleration voltage or a dose amount, or the thickness of the gate insulating layer 406 through which the oxygen passes. The oxygen implantation treatment is performed so that the amount of oxygen contained in the amorphous oxide semiconductor layer 404 exceeds that in the stoichiometric composition. For example, a peak of the concentration of oxygen in the amorphous oxide semiconductor layer 404, which is introduced by the oxygen implantation treatment, is preferably higher than or equal to $1\times10^{18}/\text{cm}^3$ and lower than or equal to $5\times10^{21}/\text{cm}^3$. The oxygen 421 for implantation includes an oxygen radical, an oxygen atom, and/or an oxygen ion. Note that the oxygen-excess region may exist in part (including an interface) of the amorphous oxide semiconductor layer 404.

Oxygen is one of main components of an oxide semiconductor. Therefore, it is difficult to accurately estimate the oxygen concentration of an oxide semiconductor film by a method such as secondary ion mass spectrometry (SIMS). That is, it is difficult to determine whether oxygen is intentionally added to the amorphous oxide semiconductor layer.

It is known that isotopes such as $^{17}$O and $^{18}$O exist in oxygen and that the proportions of $^{17}$O and $^{18}$O in all of the oxygen atoms in nature are 0.037% and 0.204%, respectively. That is to say, it is possible to measure the concentrations of these isotopes in the amorphous oxide semiconductor layer by a method such as SIMS; therefore, the oxygen concentration of the amorphous oxide semiconductor layer may be able to be estimated more accurately by measuring the concentration of such an isotope. Thus, the concentration of the isotope may be measured to determine whether oxygen is intentionally added to the amorphous oxide semiconductor layer.

Part of the oxygen 421 added to (contained in) the amorphous oxide semiconductor layer 404 may have a dangling bond in the oxide semiconductor. This is because such a dangling bond is bonded with hydrogen remaining in the layer so that hydrogen can be fixed (made to be an immovable ion).

Next, a conductive film which is to be a gate electrode (including a wiring formed in the same layer as the gate electrode) is formed over the gate insulating layer 406 and is processed, so that the gate electrode 410 is formed. The gate electrode 410 can be formed by a plasma CVD method, a sputtering method, or the like with the use of a metal material such as molybdenum, titanium, tantalum, tungsten, aluminum, copper, neodymium, or scandium, or an alloy material containing any of these materials as a main component. Alternatively, a semiconductor film typified by a polycrystalline silicon film doped with an impurity element such as phosphorus, or a silicide film such as a nickel silicide film may be used for the gate electrode 410. The gate electrode 410 may have either a single-layer structure or a stacked structure.

Figure 3D:
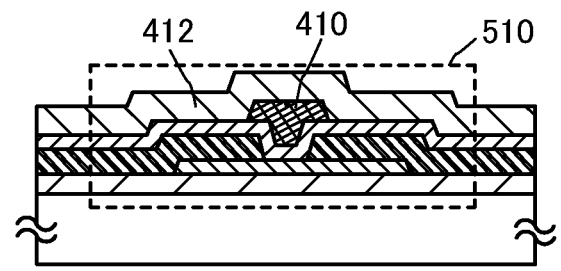

Next, the insulating layer 412 which covers the gate electrode 410 is formed (see FIG. 3D). A layer including an aluminum oxide film can be used as the insulating layer 412. That is, the insulating layer 412 contains aluminum oxide. An aluminum oxide film has a barrier property and thus is less likely to transmit moisture, oxygen, and another impurity. Therefore, by providing an aluminum oxide film over the amorphous oxide semiconductor layer 404, the aluminum oxide film functions as a passivation film and prevents an impurity such as moisture from entering the amorphous oxide semiconductor layer 404 from the outside after completion of the device. Moreover, release of oxygen from the amorphous oxide semiconductor layer 404 can be prevented.

Further, the insulating layer 412 may have a stacked structure including the aluminum oxide film and an oxide insulating film (e.g., a silicon oxide film or a silicon oxynitride film) including an oxygen-excess region.

The insulating layer 412 has a thickness of at least 1 nm and can be formed by a method by which impurities such as water and hydrogen do not enter the insulating layer 412, such as a sputtering method, as appropriate. When hydrogen is contained in the insulating layer 412, hydrogen may possibly enter the amorphous oxide semiconductor layer 404 or abstract oxygen in the amorphous oxide semiconductor layer 404. Therefore, it is important to employ a film formation method in which hydrogen is not used so that the insulating layer 412 does not contain hydrogen as much as possible. It is preferable that a high-purity gas from which impurities such as hydrogen, water, a compound having a hydroxyl group, and a hydride are removed be used as a sputtering gas for the formation of the insulating layer 412.

After the insulating layer 412 is formed, thermal treatment (second thermal treatment) is performed. The thermal treatment is performed at a temperature at which the amorphous oxide semiconductor layer 404 is not crystallized, preferably higher than or equal to 250° C. and lower than or equal to 450° C. The thermal treatment may be performed in an atmosphere of nitrogen, oxygen, ultra-dry air (air in which the water content is less than or equal to 20 ppm, preferably less than or equal to 1 ppm, further preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. The purity of nitrogen, oxygen, or a rare gas which is introduced into a thermal treatment apparatus is preferably higher than or equal to 6N (99.9999%), further preferably higher than or equal to 7N (99.99999%) (that is, the impurity concentration is preferably lower than or equal to 1 ppm, further preferably lower than or equal to 0.1 ppm).

Although the timing of the thermal treatment (second thermal treatment) performed after the oxygen implantation treatment is not limited to that in this embodiment, the thermal treatment needs to be performed at least after the insulating layer 412 is formed. This is because, since the aluminum oxide film used as the insulating layer 412 has a high blocking effect and thus is less likely to transmit both oxygen and impurities such as hydrogen and moisture, release of oxygen from the amorphous oxide semiconductor layer 404 can be prevented by performing the thermal treatment after the insulating layer 412 is formed.

By the second thermal treatment, oxygen may be supplied to the amorphous oxide semiconductor layer 404 from the insulating film (e.g., the gate insulating layer 406 or the base insulating layer 402) which contains oxygen and is in contact with the amorphous oxide semiconductor layer 404.

Through the above steps, the transistor 510 is formed (see FIG. 3D). In the formation of the transistor 510, by the thermal treatment for dehydration or dehydrogenation, impurities such as hydrogen, water, a hydroxyl group, and a hydride (also referred to as a hydrogen compound) can be intentionally removed from the amorphous oxide semiconductor layer; by the subsequent oxygen implantation treatment, oxygen, which is decreased in concentration through the thermal treatment for dehydration or dehydrogenation, can be supplied to the amorphous oxide semiconductor layer. Thus, the amorphous oxide semiconductor layer can be highly purified and become an electrically i-type (intrinsic) semiconductor.

Further, an oxygen-excess region is formed by the oxygen implantation treatment, whereby formation of an oxygen vacancy in the amorphous oxide semiconductor layer or at the interface thereof can be suppressed and the number of donor levels in the energy gap due to oxygen vacancies can be reduced or the donor levels can be substantially removed. Therefore, variation in the electric characteristics of the transistor 510 is suppressed, and the transistor 510 is electrically stable. The amorphous oxide semiconductor layer has an amorphous structure in whole, and thus has uniform film quality as compared with a partly crystallized oxide semiconductor layer.

According to this embodiment, a semiconductor device which includes an amorphous oxide semiconductor and has stable electric characteristics can be provided. Further, a highly reliable semiconductor device can be provided.

The methods, structures, and the like described in this embodiment can be combined as appropriate with any of the methods, structures, and the like described in the other embodiments.

Embodiment 2

In this embodiment, a method of manufacturing the transistor 510, which is different from that in Embodiment 1, will be described with reference to FIGS. 4A to 4D. Note that the same portions as Embodiment 1 or portions having functions similar to those of Embodiment 1 can be formed as in Embodiment 1, and also the same steps as Embodiment 1 or steps similar to those of Embodiment 1 can be performed as in Embodiment 1; therefore, repetitive description thereof is omitted. In addition, detailed description of the same portions is not repeated.

Figure 4A:
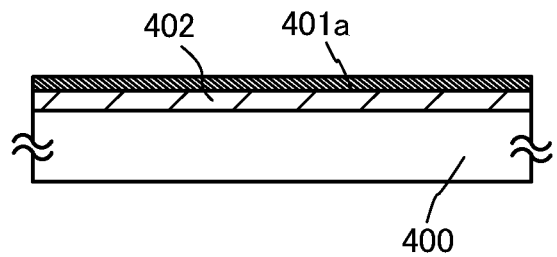
FIGS. 4A to 4D are cross-sectional views which illustrate one embodiment of a method of manufacturing a semiconductor device.
Figure 4B:
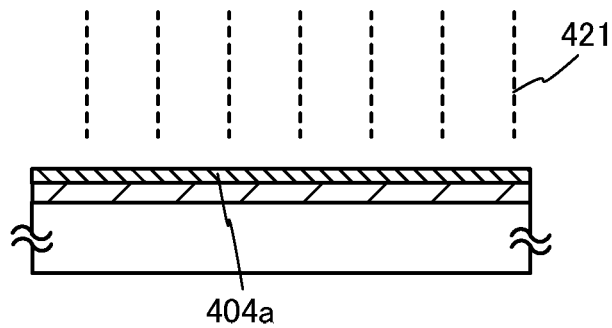

First, the base insulating layer 402 is formed over the substrate 400 having an insulating surface, and then an oxide semiconductor layer 401a is formed in contact with the base insulating layer 402 (see FIG. 4A).

In this embodiment, the oxide semiconductor layer 401a can be formed using a material similar to that described in Embodiment 1. In addition, the oxide semiconductor layer 401a may have an amorphous structure or include a crystalline region.

In formation of the oxide semiconductor layer 401a by a sputtering method, the concentration of hydrogen contained in the oxide semiconductor layer 401a is preferably reduced as much as possible. In order to reduce the hydrogen concentration, a high-purity rare gas (typically argon), high-purity oxygen, or a high-purity mixed gas of a rare gas and oxygen, from which impurities such as hydrogen, water, a compound having a hydroxyl group, and a hydride are removed, is supplied into a treatment chamber of a sputtering apparatus as an atmosphere gas, as appropriate.

In order to reduce the concentration of impurities contained in the oxide semiconductor layer 401a, it is also effective to form the oxide semiconductor layer 401a while the substrate 400 is kept at a high temperature. The temperature at which the substrate 400 is heated may be higher than or equal to 150° C. and lower than or equal to 450° C.; the substrate temperature is preferably higher than or equal to 200° C. and lower than or equal to 350° C. Note that when the substrate is heated at a high temperature during the film formation, an oxide semiconductor layer including a crystalline region may be formed.

In this embodiment, the oxide semiconductor layer 401a is formed to include a crystalline region at least partly, by heating the substrate during the film formation.

Next, the formed oxide semiconductor layer 401a is subjected to thermal treatment (first thermal treatment) for dehydration or dehydrogenation. In this embodiment, the first thermal treatment is performed at a temperature higher than or equal to 250° C. and lower than or equal to 700° C., preferably higher than or equal to 450° C. and lower than or equal to 600° C. or lower than the strain point of the substrate. The first thermal treatment is preferably performed at a high temperature (e.g., a temperature higher than 400° C.) because release of an impurity from the oxide semiconductor layer 401a is enhanced. Note that, when the first thermal treatment is performed at a high temperature, part of the oxide semiconductor layer 401a might be crystallized or the crystalline region might be expanded.

Then, the oxygen 421 is implanted into the oxide semiconductor layer 401a. The oxygen 421 can be implanted as in Embodiment 1. By the oxygen implantation treatment, a crystal structure included in the oxide semiconductor layer 401a is broken to be an amorphous structure, so that the amorphous oxide semiconductor layer 404a including an oxygen-excess region is formed (see FIG. 4B).

By the implantation treatment of the oxygen 421, oxygen in the amorphous oxide semiconductor layer 404a, which is decreased in concentration through the above thermal treatment for dehydration or dehydrogenation, can be supplied. Thus, the amorphous oxide semiconductor layer 404a can be highly purified and become an electrically i-type (intrinsic) semiconductor. Further, formation of the oxygen-excess region in the amorphous oxide semiconductor layer 404a enables an oxygen vacancy therein to be compensated. Thus, charge trapping centers in the amorphous oxide semiconductor layer 404a can be reduced.

In this embodiment, an example is shown in which the oxygen 421 is implanted with a surface of the oxide semiconductor layer 401a exposed. Note that an embodiment of the present invention is not limited to this manner; it is also possible to implant oxygen into the amorphous oxide semiconductor layer 404 through the gate insulating layer 406 or the insulating layer 412.

Next, the amorphous oxide semiconductor layer 404a is processed into the island-shaped amorphous oxide semiconductor layer 404 in a photolithography step. A conductive film which is to be a source electrode and a drain electrode (including a wiring formed in the same layer as the source electrode and the drain electrode) is formed over the amorphous oxide semiconductor layer 404 and is processed, so that the source electrode 405a and the drain electrode 405b are formed.

Figure 4C:
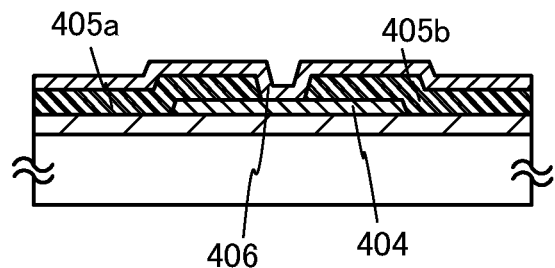

Next, the gate insulating layer 406 which covers the source electrode 405a and the drain electrode 405b and is in contact with part of the amorphous oxide semiconductor layer 404 is formed (see FIG. 4C).

Next, a conductive film which is to be a gate electrode (including a wiring formed in the same layer as the gate electrode) is formed over the gate insulating layer 406 and is processed, so that the gate electrode 410 is formed. After that, the insulating layer 412 which covers the gate electrode 410 is formed (see FIG. 4D).

After the insulating layer 412 is formed, thermal treatment (second thermal treatment) is performed. The thermal treatment is performed at a temperature at which the amorphous oxide semiconductor layer 404 is not crystallized, preferably higher than or equal to 250° C. and lower than or equal to 450° C.

Figure 4D:
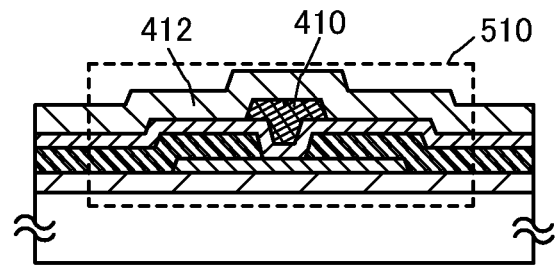

Through the above steps, the transistor 510 is formed (see FIG. 4D). Variation in the electric characteristics of the transistor 510 is suppressed, and the transistor 510 is electrically stable.

According to this embodiment, a semiconductor device which includes an amorphous oxide semiconductor and has stable electric characteristics can be provided. Further, a highly reliable semiconductor device can be provided.

The methods, structures, and the like described in this embodiment can be combined as appropriate with any of the methods, structures, and the like described in the other embodiments.

Embodiment 3

In this embodiment, another embodiment of a semiconductor device and another embodiment of a method of manufacturing the semiconductor device will be described with reference to FIGS. 5A to 5C, FIGS. 6A to 6C, and FIGS. 7A to 7D. Note that the same portions as the above embodiment or portions having functions similar to those of the above embodiment can be formed as in the above embodiment, and also the same steps as the above embodiment or steps similar to those of the above embodiment can be performed as in the above embodiment; therefore, repetitive description thereof is omitted. In addition, detailed description of the same portions is not repeated.

Figure 5A:
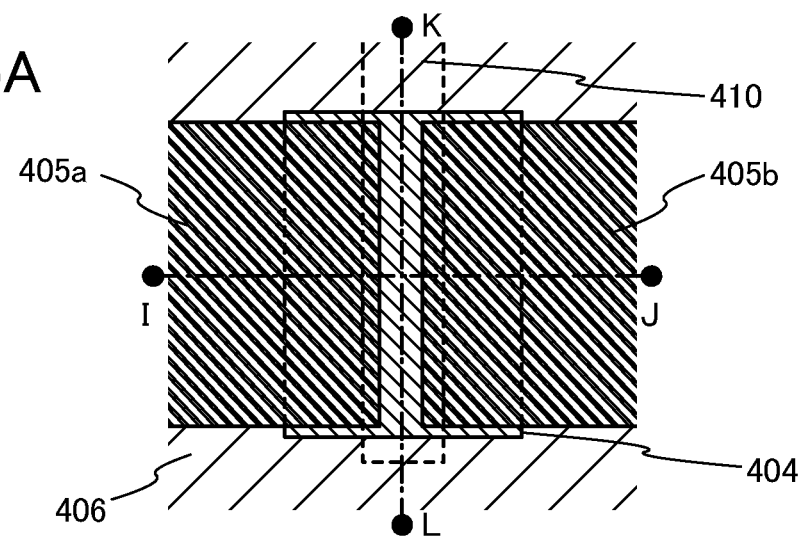
FIGS. 5A to 5C are a plan view and cross-sectional views which illustrate one embodiment of a semiconductor device.
Figure 5B:
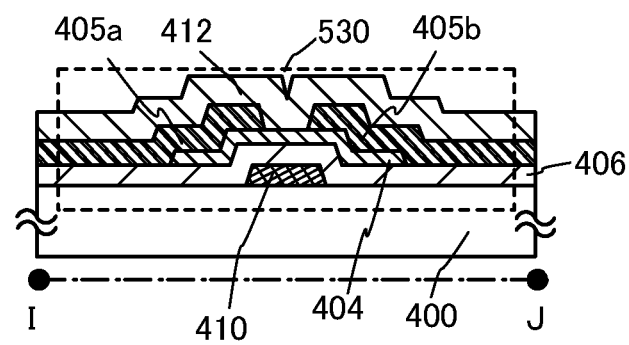
Figure 5C:
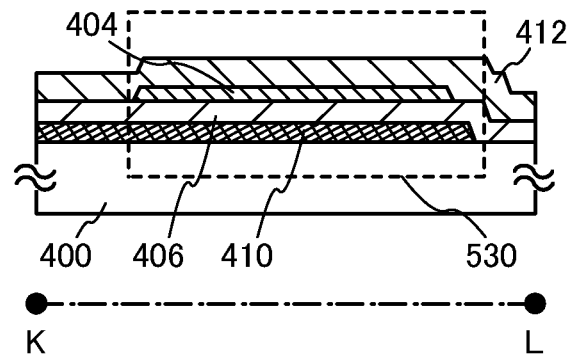

FIGS. 5A to 5C are a plan view and cross-sectional views which illustrate a bottom-gate transistor 530 as an example of a semiconductor device. FIG. 5A is a plan view, and FIGS. 5B and 5C are cross-sectional views along line I-J and line K-L in FIG. 5A, respectively. Note that in FIG. 5A, some components of the transistor 530 (e.g., the insulating layer 412) are omitted for brevity.

The transistor 530 illustrated in FIGS. 5A to 5C includes, over the substrate 400 having an insulating surface, the gate electrode 410, the gate insulating layer 406, the amorphous oxide semiconductor layer 404, the source electrode 405a, the drain electrode 405b, and the insulating layer 412.

In the transistor 530 illustrated in FIGS. 5A to 5C, the amorphous oxide semiconductor layer 404 has been subjected to oxygen implantation treatment and includes an oxygen-excess region. By performing oxygen implantation treatment, a sufficient amount of oxygen can be contained in the amorphous oxide semiconductor layer 404, so that the transistor 530 can have higher reliability.

In the transistor 530 illustrated in FIGS. 5A to 5C, the gate insulating layer 406 which is an insulating layer in contact with the amorphous oxide semiconductor layer 404 preferably includes an oxygen-excess region. When the gate insulating layer 406 includes an oxygen-excess region, oxygen can be prevented from moving from the amorphous oxide semiconductor layer 404 to the gate insulating layer 406, and oxygen can be supplied from the gate insulating layer 406 to the amorphous oxide semiconductor layer 404.

Similarly, it is preferable that the insulating layer 412 have a stacked structure including an aluminum oxide film and an oxide insulating film (such as a silicon oxide film or a silicon oxynitride film) which is in contact with the amorphous oxide semiconductor layer 404 and includes an oxygen-excess region. When the oxide insulating film includes an oxygen-excess region, an oxygen vacancy in the amorphous oxide semiconductor layer 404 can be compensated by excess oxygen contained in the oxide insulating film.

Figure 6A:
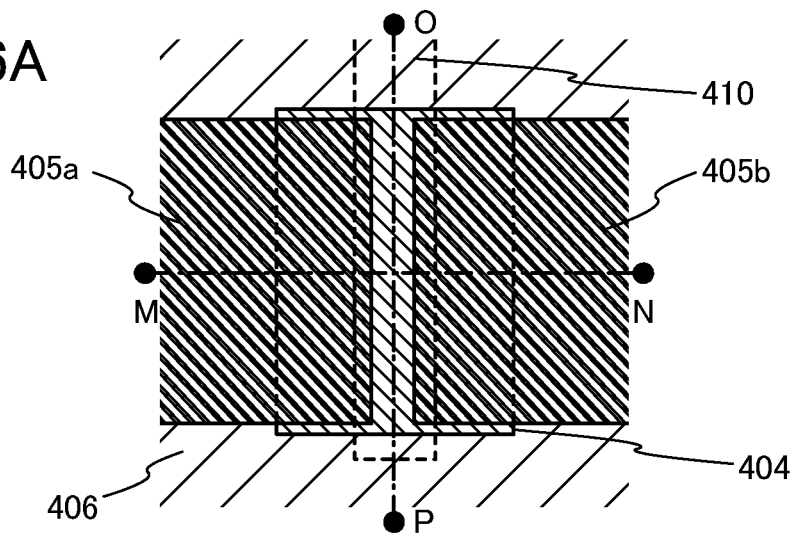
FIGS. 6A to 6C are a plan view and cross-sectional views which illustrate one embodiment of a semiconductor device.
Figure 6B:
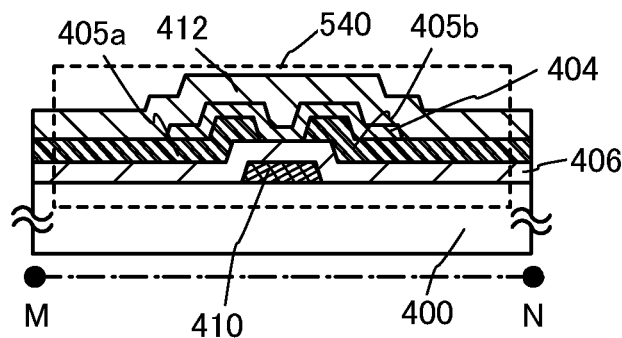
Figure 6C:
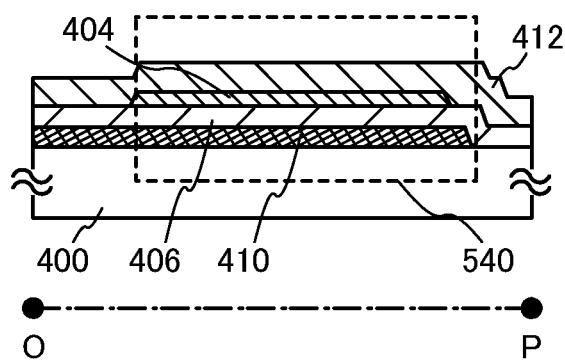

FIGS. 6A to 6C illustrate another structure example of a transistor according to this embodiment. FIG. 6A is a plan view of a transistor 540, and FIGS. 6B and 6C are cross-sectional views along line M-N and line O-P in FIG. 6A, respectively. Note that in FIG. 6A, some components of the transistor 540 (e.g., the insulating layer 412) are omitted for brevity.

As in the case of the transistor 530 illustrated in FIGS. 5A to 5C, the transistor 540 illustrated in FIGS. 6A to 6C includes, over the substrate 400 having an insulating surface, the gate electrode 410, the gate insulating layer 406, the amorphous oxide semiconductor layer 404, the source electrode 405a, the drain electrode 405b, and the insulating layer 412.

A difference between the transistor 540 illustrated in FIGS. 6A to 6C and the transistor 530 illustrated in FIGS. 5A to 5C is the stacking order of the source and drain electrodes 405a and 405b and the amorphous oxide semiconductor layer 404. That is, the transistor 540 includes the source electrode 405a and the drain electrode 405b which are in contact with the gate insulating layer 406, and the amorphous oxide semiconductor layer 404 which is provided over the source electrode 405a and the drain electrode 405b and is at least partly in contact with the gate insulating layer 406. The other components are similar to those of the transistor 530, and thus the description of the transistor 530 can be referred to for the details.

FIGS. 7A to 7D illustrate an example of a method of manufacturing the transistor 530. Note that the transistor 540 can be manufactured in a process similar to that of the transistor 530 except for the stacking order of the source and drain electrodes 405a and 405b and the amorphous oxide semiconductor layer 404.

First, a conductive film is formed over the substrate 400 having an insulating surface, and then the gate electrode 410 is formed in a photolithography step.

Note that an insulating layer serving as a base film may be provided between the substrate 400 and the gate electrode 410. The base film has a function of preventing diffusion of an impurity element from the substrate 400, and can be formed to have a single-layer or stacked structure including one or more films selected from a silicon nitride film, a silicon oxide film, a silicon nitride oxide film, and a silicon oxynitride film.

Figure 7A:
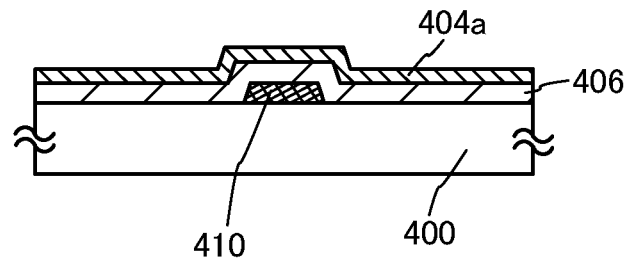
FIGS. 7A to 7D are cross-sectional views which illustrate one embodiment of a method of manufacturing a semiconductor device.

Next, the gate insulating layer 406 is formed over the gate electrode 410, and the amorphous oxide semiconductor layer 404a having a thickness greater than or equal to 2 nm and less than or equal to 200 nm, preferably greater than or equal to 5 nm and less than or equal to 30 nm, is formed over the gate insulating layer 406 (see FIG. 7A). The amorphous oxide semiconductor layer 404a can be formed as in the step in FIG. 3A.

Note that it is preferable that the gate insulating layer 406 and the amorphous oxide semiconductor layer 404a be successively formed without exposure to the air. For example, the following steps may be performed: impurities containing hydrogen attached to a surface of the substrate 400 and a surface of the gate electrode 410 are removed by thermal treatment or plasma treatment, and then the gate insulating layer 406 and the amorphous oxide semiconductor layer 404a are successively formed in this order without exposure to the air. In this manner, impurities containing hydrogen attached to a surface of the gate insulating layer 406 can be reduced and an atmospheric component can be prevented from being attached to an interface between the gate insulating layer 406 and the substrate 400 or the gate electrode 410 and an interface between the gate insulating layer 406 and the amorphous oxide semiconductor layer 404a. As a result, it is possible to manufacture the transistor 530 having favorable electric characteristics and high reliability. Also in the case where the insulating layer serving as a base film is formed, it is preferable that the insulating layer, the gate insulating layer 406, and the amorphous oxide semiconductor layer 404a be successively formed without exposure to the air.

Next, thermal treatment (first thermal treatment) is performed on the amorphous oxide semiconductor layer 404a in order to remove hydrogen (including water and a hydroxyl group) (dehydration or dehydrogenation). The thermal treatment is performed at a temperature at which the amorphous oxide semiconductor layer 404a is not crystallized, typically, higher than or equal to 250° C. and lower than or equal to 450° C., preferably lower than or equal to 300° C.

Figure 7B:
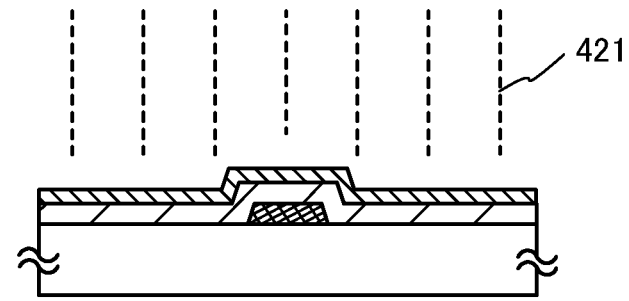
Figure 7C:
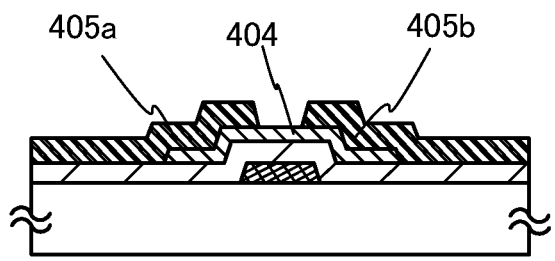

Then, the oxygen 421 is implanted into the amorphous oxide semiconductor layer 404a (see FIG. 7B). The oxygen 421 can be implanted as in Embodiment 1. In this embodiment, the implantation treatment of the oxygen 421 is performed with a surface of the amorphous oxide semiconductor layer 404a exposed; therefore, plasma treatment may be carried out so that the amorphous oxide semiconductor layer 404a is exposed in an atmosphere of the plasmatized oxygen 421, instead of the above implantation method. Alternatively, these methods may be combined.

By the implantation treatment of the oxygen 421, oxygen in the amorphous oxide semiconductor layer 404a, which is decreased in concentration through the above thermal treatment for dehydration or dehydrogenation, can be supplied. Thus, the amorphous oxide semiconductor layer 404a can be highly purified and become an electrically i-type (intrinsic) semiconductor. Further, formation of an oxygen-excess region in the amorphous oxide semiconductor layer 404a enables an oxygen vacancy to be compensated. Thus, charge trapping centers in the amorphous oxide semiconductor layer 404a can be reduced.

In this embodiment, an example is shown in which the oxygen 421 is implanted with the surface of the amorphous oxide semiconductor layer 404a exposed. Note that an embodiment of the present invention is not limited to this manner; it is also possible to implant oxygen into the amorphous oxide semiconductor layer 404 through the insulating layer 412.

Next, the amorphous oxide semiconductor layer 404a is processed into the island-shaped amorphous oxide semiconductor layer 404 in a photolithography step. After that, a conductive film which is to be a source electrode and a drain electrode (including a wiring formed in the same layer as the source electrode and the drain electrode) is formed over the amorphous oxide semiconductor layer 404 and is processed, so that the source electrode 405a and the drain electrode 405b are formed (see FIG. 7C).

Figure 7D:
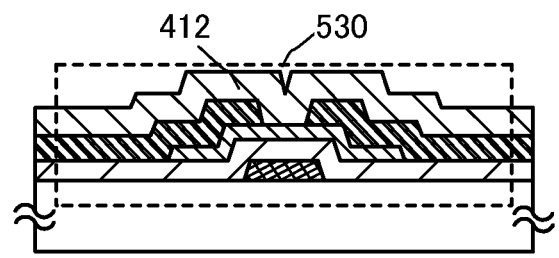

Next, the insulating layer 412 which covers the source electrode 405a and the drain electrode 405b is formed (see FIG. 7D).

After the insulating layer 412 is formed, thermal treatment (second thermal treatment) is performed. The thermal treatment is performed at a temperature at which the amorphous oxide semiconductor layer 404 is not crystallized, preferably higher than or equal to 250° C. and lower than or equal to 450° C.

Through the above steps, the transistor 530 is formed (see FIG. 7D). Variation in the electric characteristics of the transistor 530 is suppressed, and the transistor 530 is electrically stable.

According to this embodiment, a semiconductor device which includes an amorphous oxide semiconductor and has stable electric characteristics can be provided. Further, a highly reliable semiconductor device can be provided.

The methods, structures, and the like described in this embodiment can be combined as appropriate with any of the methods, structures, and the like described in the other embodiments.

Embodiment 4

In this embodiment, a method of manufacturing the transistor 530, which is different from that in Embodiment 3, will be described with reference to FIGS. 8A to 8D. Note that the same portions as the above embodiment or portions having functions similar to those of the above embodiment can be formed as in the above embodiment, and also the same steps as the above embodiment or steps similar to those of the above embodiment can be performed as in the above embodiment; therefore, repetitive description thereof is omitted. In addition, detailed description of the same portions is not repeated.

First, a conductive film is formed over the substrate 400 having an insulating surface, and then the gate electrode 410 is formed in a photolithography step. Next, the gate insulating layer 406 is formed over the gate electrode 410, and the oxide semiconductor layer 401a having a thickness greater than or equal to 2 nm and less than or equal to 200 nm, preferably greater than or equal to 5 nm and less than or equal to 30 nm, is formed over the gate insulating layer 406 (see FIG. 8A). The oxide semiconductor layer 401a can be formed as in the step in FIG. 4A. The oxide semiconductor layer 401a may have an amorphous structure or include a crystalline region.

In this embodiment, the oxide semiconductor layer 401a is formed to include a crystalline region at least partly, by heating the substrate during the film formation.

Next, the formed oxide semiconductor layer 401a is subjected to thermal treatment (first thermal treatment) for dehydration or dehydrogenation. In this embodiment, the first thermal treatment is performed at a temperature higher than or equal to 250° C. and lower than or equal to 700° C., preferably higher than or equal to 450° C. and lower than or equal to 600° C. or lower than the strain point of the substrate. The first thermal treatment is preferably performed at a high temperature (e.g., a temperature higher than 400° C.) because release of an impurity from the oxide semiconductor layer 401a is enhanced. Note that, when the first thermal treatment is performed at a high temperature, part of the oxide semiconductor layer 401a might be crystallized or the crystalline region might be expanded.

Next, the oxide semiconductor layer 401a is processed into an island-shaped oxide semiconductor layer 401 in a photolithography step. After that, a conductive film which is to be a source electrode and a drain electrode (including a wiring formed in the same layer as the source electrode and the drain electrode) is formed over the oxide semiconductor layer 401 and is processed, so that the source electrode 405a and the drain electrode 405b are formed.

Figure 8A:
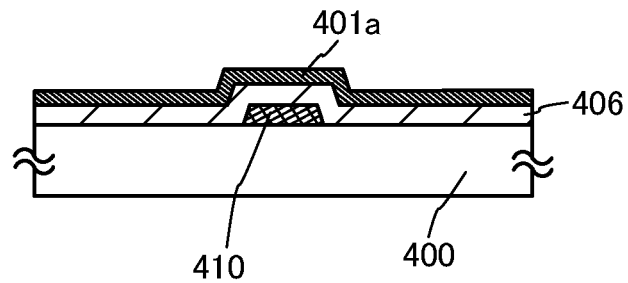
FIGS. 8A to 8D are cross-sectional views which illustrate one embodiment of a method of manufacturing a semiconductor device.
Figure 8B:
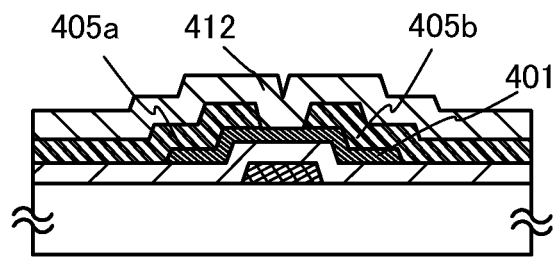

Next, the insulating layer 412 which covers the source electrode 405a and the drain electrode 405b and is in contact with part of the oxide semiconductor layer 401 is formed (see FIG. 8B).

Figure 8C:
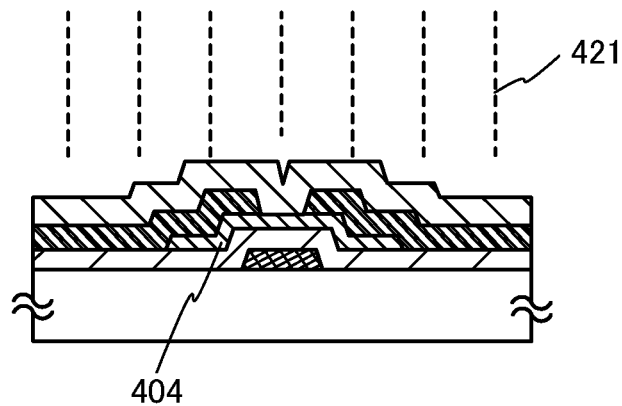

Then, the oxygen 421 is implanted into the oxide semiconductor layer 401 through the insulating layer 412 (see FIG. 8C). By the oxygen implantation treatment, a crystal structure included in the oxide semiconductor layer 401 is broken to be an amorphous structure, so that the amorphous oxide semiconductor layer 404 including an oxygen-excess region is formed.

By the implantation treatment of the oxygen 421, oxygen, which is decreased in concentration through the above thermal treatment for dehydration or dehydrogenation, can be supplied. Thus, the amorphous oxide semiconductor layer 404 can be highly purified and become an electrically i-type (intrinsic) semiconductor. Further, formation of the oxygen-excess region in the amorphous oxide semiconductor layer 404 enables an oxygen vacancy therein to be compensated. Thus, charge trapping centers in the amorphous oxide semiconductor layer 404 can be reduced.

After the oxygen 421 is implanted, thermal treatment (second thermal treatment) is performed. The thermal treatment is performed at a temperature at which the amorphous oxide semiconductor layer 404 is not crystallized, preferably higher than or equal to 250° C. and lower than or equal to 450° C.

Figure 8D:
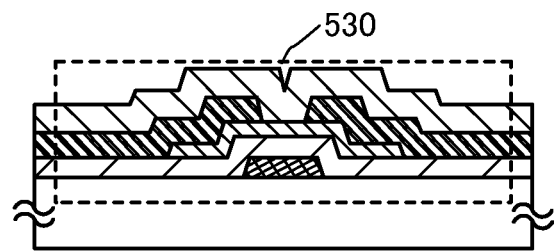

Through the above steps, the transistor 530 is formed (see FIG. 8D). Variation in the electric characteristics of the transistor 530 is suppressed, and the transistor 530 is electrically stable.

According to this embodiment, a semiconductor device which includes an amorphous oxide semiconductor and has stable electric characteristics can be provided. Further, a highly reliable semiconductor device can be provided.

The methods, structures, and the like described in this embodiment can be combined as appropriate with any of the methods, structures, and the like described in the other embodiments.

Embodiment 5

A semiconductor device having a display function (also referred to as a display device) can be manufactured using any of the transistors described in Embodiments 1 to 4. Moreover, some or all of driver circuits which include transistors can be formed over a substrate where a pixel portion is formed, whereby a system-on-panel can be obtained.

In FIG. 9A, a sealant 4005 is provided so as to surround a pixel portion 4002 provided over a first substrate 4001, and the pixel portion 4002 is sealed by using a second substrate 4006. In FIG. 9A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Various signals and potentials which are provided to the pixel portion 4002 through the signal line driver circuit 4003 and the scan line driver circuit 4004 are supplied from flexible printed circuits (FPCs) 4018a and 4018b.

In FIGS. 9B and 9C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 9B and 9C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 9B and 9C, various signals and potentials which are provided to the pixel portion 4002 through the signal line driver circuit 4003 and the scan line driver circuit 4004 are supplied from an FPC 4018.

Although FIGS. 9B and 9C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that there is no particular limitation on the method of connecting a separately formed driver circuit, and a chip on glass (COG) method, a wire bonding method, a tape automated bonding (TAB) method, or the like can be used. FIG. 9A illustrates an example in which the signal line driver circuit 4003 and the scan line driver circuit 4004 are mounted by a COG method. FIG. 9B illustrates an example in which the signal line driver circuit 4003 is mounted by a COG method. FIG. 9C illustrates an example in which the signal line driver circuit 4003 is mounted by a TAB method.

Note that the display device includes a panel in which the display element is sealed, and a module in which an IC including a controller or the like is mounted on the panel.

Specifically, a display device in this specification means an image display device, a display device, or a light source (including a lighting device). Furthermore, the display device also includes not only a panel in which the display element is sealed but also the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors; any of the transistors described in Embodiments 1 to 4 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Furthermore, a display medium whose contrast is changed by an electric effect, such as an electronic ink display (electronic paper), can be used.

Figure 10:
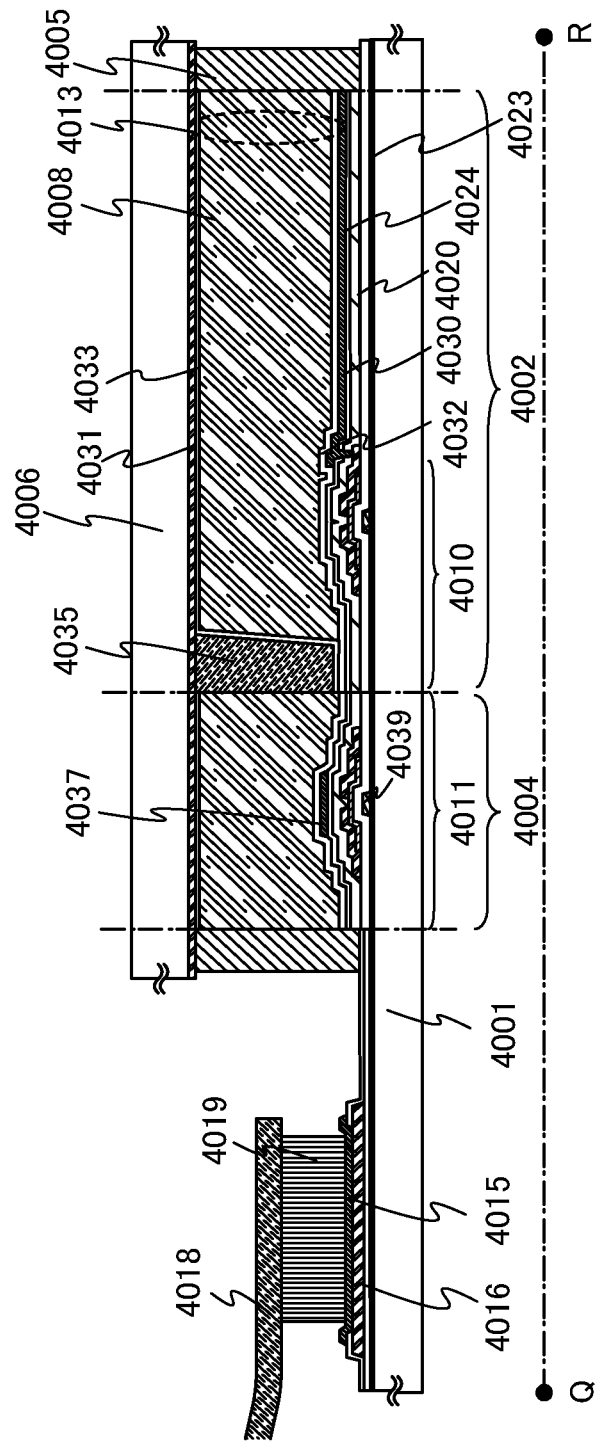
FIG. 10 illustrates one embodiment of a semiconductor device.
Figure 11:
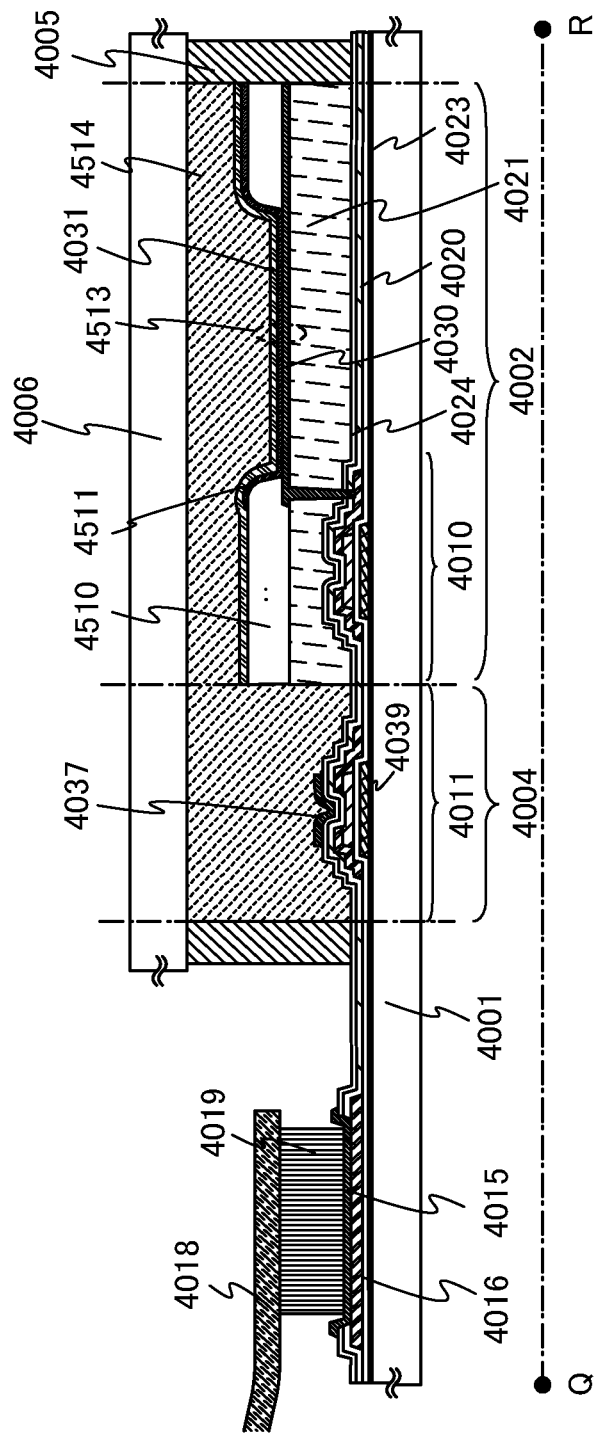
FIG. 11 illustrates one embodiment of a semiconductor device.
Figure 12:
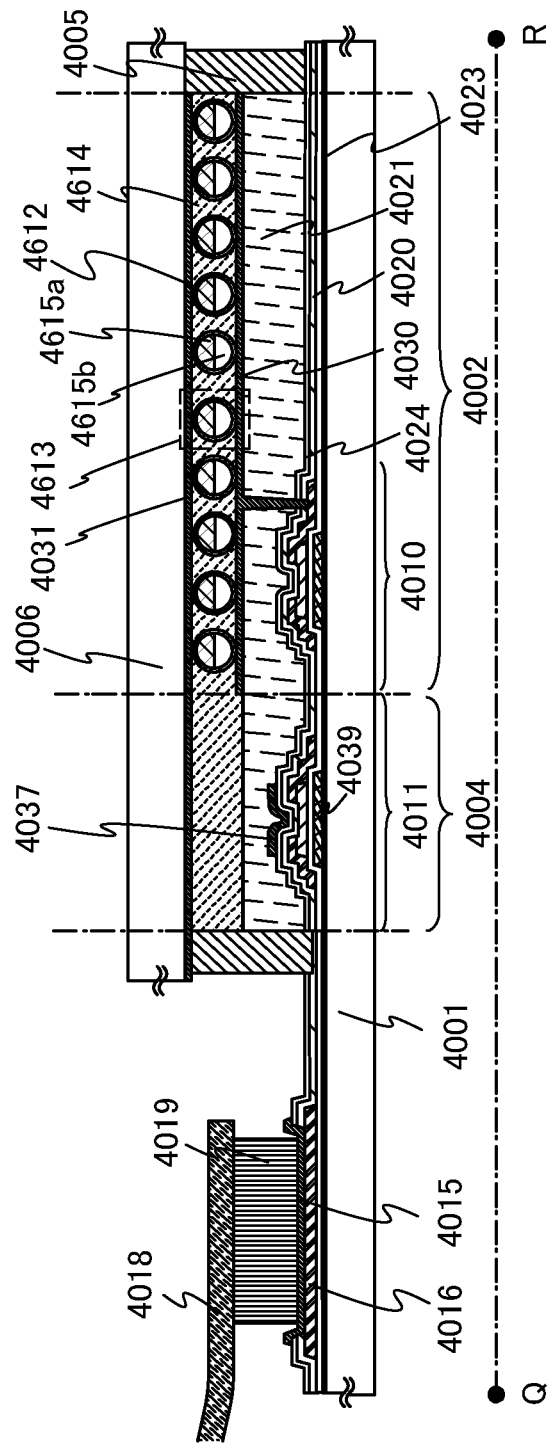
FIG. 12 illustrates one embodiment of a semiconductor device.

Embodiments of the semiconductor device will be described with reference to FIG. 10, FIG. 11, and FIG. 12. FIG. 10, FIG. 11, and FIG. 12 correspond to cross-sectional views along line Q-R in FIG. 9B.

As illustrated in FIG. 10, FIG. 11, and FIG. 12, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode 4030, and the terminal electrode 4016 is formed using the same conductive film as source electrodes and drain electrodes of transistors 4010 and 4011.

The pixel portion 4002 and the scan line driver circuit 4004 which are provided over the first substrate 4001 include a plurality of transistors. FIG. 10, FIG. 11, and FIG. 12 illustrate the transistor 4010 included in the pixel portion 4002 and the transistor 4011 included in the scan line driver circuit 4004 as an example. In FIG. 10, FIG. 11, and FIG. 12, an insulating layer 4020 and an insulating layer 4024 are provided over the transistors 4010 and 4011. In FIG. 11 and FIG. 12, an insulating layer 4021 is further provided. Note that an insulating layer 4023 in FIGS. 10 to 12 is an insulating layer serving as a base film.

Any of the transistors described in Embodiments 1 to 4 can be applied to the transistor 4010 and the transistor 4011.

Each of the transistor 4010 and the transistor 4011 includes a highly purified amorphous oxide semiconductor layer including an oxygen-excess region. Therefore, variation in the electric characteristics of the transistor 4010 and the transistor 4011 is suppressed, and the transistor 4010 and the transistor 4011 are electrically stable.

Thus, as the semiconductor devices of this embodiment illustrated in FIG. 10, FIG. 11, and FIG. 12, a highly reliable semiconductor device can be provided.

In this embodiment, a conductive layer 4037 is provided over the insulating layer so as to overlap with a channel formation region of the amorphous oxide semiconductor layer in the transistor 4011 for the driver circuit, whereby the amount of change in the threshold voltage of the transistor 4011 can be further reduced. The potential of the conductive layer 4037 may be the same as or different from that of a gate electrode 4039 of the transistor 4011. The conductive layer 4037 can also function as a second gate electrode. The potential of the conductive layer 4037 may be GND or 0V, or the conductive layer 4037 may be in a floating state.

The conductive layer 4037 functions to block an external electric field, that is, to prevent an external electric field (particularly, to prevent static electricity) from affecting the inside (a circuit portion including a thin film transistor). The blocking function of the conductive layer 4037 can prevent variation in the electric characteristics of the transistor 4011 due to the influence of an external electric field such as static electricity.

The transistor 4010 provided in the pixel portion 4002 is electrically connected to a display element to form a display panel. A variety of display elements can be used as the display element as long as display can be performed.

An example of a liquid crystal display device using a liquid crystal element as a display element is illustrated in FIG. 10. In FIG. 10, a liquid crystal element 4013 includes the first electrode 4030, a second electrode 4031, and a liquid crystal layer 4008. Note that an insulating layer 4032 and an insulating layer 4033 which function as alignment films are provided so that the liquid crystal layer 4008 is interposed therebetween. The second electrode 4031 is provided on the second substrate 4006 side. The first electrode 4030 and the second electrode 4031 are stacked with the liquid crystal layer 4008 interposed therebetween.

A columnar spacer denoted by reference numeral 4035 is obtained by selective etching of an insulating layer and is provided in order to control the thickness (cell gap) of the liquid crystal layer 4008. Alternatively, a spherical spacer may be used.

In the case where a liquid crystal element is used as the display element, a thermotropic liquid crystal, a ferroelectric liquid crystal, an anti-ferroelectric liquid crystal, or the like can be used. These liquid crystals may be any of a compound with a low molecular weight and a polymer. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which appears just before a cholesteric phase changes into an isotropic phase while the temperature of a cholesteric liquid crystal is increased. Since the blue phase appears only in a narrow temperature range, a liquid crystal composition in which several weight percent or more of a chiral agent is mixed is used for the liquid crystal layer in order to improve the temperature range. The liquid crystal composition which includes a liquid crystal exhibiting a blue phase and a chiral agent has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved.

The specific resistivity of the liquid crystal material is higher than or equal to $1\times10^9 \Omega \cdot cm$, preferably higher than or equal to $1\times10^{11} \Omega \cdot cm$, further preferably higher than or equal to $1\times10^{12} \Omega \cdot cm$. Note that the specific resistivity in this specification is measured at 20° C.

The size of a storage capacitor formed in the liquid crystal display device is set considering the leakage current of the transistor provided in the pixel portion 4002 or the like so that charge can be held for a predetermined period. The size of the storage capacitor may be set considering the off-state current of the transistor or the like. By using a transistor which includes a highly purified amorphous oxide semiconductor layer including an oxygen-excess region, it is enough to provide a storage capacitor having a capacitance that is ⅓ or less, preferably ⅕ or less, of liquid crystal capacitance of each pixel.

In the transistor used in this embodiment, which includes a highly purified amorphous oxide semiconductor layer in which formation of an oxygen vacancy is suppressed, the current in an off state (off-state current) can be decreased. Accordingly, an electric signal such as an image signal can be held for a longer time, and a writing interval can be set longer. Accordingly, the frequency of refresh operation can be reduced, which leads to suppression of power consumption.

The transistor used in this embodiment, which includes a highly purified amorphous oxide semiconductor layer in which formation of an oxygen vacancy is suppressed, can have relatively high field-effect mobility and thus can operate at high speed. For example, when such a transistor is used for a liquid crystal display device, a switching transistor in a pixel portion and a driver transistor in a driver circuit portion can be formed over one substrate. In addition, by using such a transistor in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. There are some examples of a vertical alignment mode; for example, a multi-domain vertical alignment (MVA) mode, a patterned vertical alignment (PVA) mode, or an ASV mode can be employed. Furthermore, this embodiment can be applied to a VA liquid crystal display device. The VA liquid crystal display device utilizes one of the alignment modes of liquid crystal molecules of a liquid crystal display panel. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may differ between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that description is made here using an organic EL element as a light-emitting element.

In order to extract light emitted from the light-emitting element, at least one of the pair of electrodes has a light-transmitting property. A transistor and the light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side. A light-emitting element having any of these emission structures can be used.

An example of a light-emitting device using a light-emitting element as a display element is illustrated in FIG. 11. A light-emitting element 4513 is electrically connected to the transistor 4010 provided in the pixel portion 4002. The structure of the light-emitting element 4513 is not limited to that shown in FIG. 11, which has a stacked structure including the first electrode 4030, an electroluminescent layer 4511, and the second electrode 4031. The structure of the light-emitting element 4513 can be changed as appropriate depending on the direction in which light is extracted from the light-emitting element 4513, or the like.

A partition wall 4510 is formed using an organic insulating material or an inorganic insulating material. It is particularly preferable that the partition wall 4510 be formed using a photosensitive resin material to have an opening over the first electrode 4030 so that a sidewall of the opening has a tilted surface with continuous curvature.

The electroluminescent layer 4511 may be formed using a single layer or a plurality of layers stacked.

A protective film may be formed over the second electrode 4031 and the partition wall 4510 in order to prevent entry of oxygen, hydrogen, moisture, carbon dioxide, and the like into the light-emitting element 4513. As the protective film, a silicon nitride film, a silicon nitride oxide film, a DLC film, or the like can be formed. In a space which is formed with the first substrate 4001, the second substrate 4006, and the sealant 4005, a filler 4514 is provided for sealing. In this manner, the light-emitting element is packaged (sealed) with the protective film (such as a laminate film or an ultraviolet curable resin film) or a cover material with high air-tightness and little degasification so that the light-emitting element is not exposed to the outside air.

As the filler 4514, an ultraviolet curable resin or a thermosetting resin can be used as well as an inert gas such as nitrogen or argon. For example, poly(vinyl chloride) (PVC), an acrylic resin, a polyimide, an epoxy resin, a silicone resin, poly(vinyl butyral) (PVB), or a copolymer of ethylene with vinyl acetate (EVA) can be used.

In addition, as needed, an optical film such as a polarizing plate, a circularly polarizing plate (including an elliptically polarizing plate), a retardation plate (quarter-wave plate or half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Electronic paper in which electronic ink is driven can be provided as the display device. The electronic paper is also referred to as an electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device includes a plurality of microcapsules dispersed in a solvent, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain a pigment and do not move in the absence of an electric field. The first particles and the second particles have different colors (which may be colorless).

A dispersion of the above microcapsules in a solvent is referred to as electronic ink. The use of a color filter or particles that have a pigment enables color display.

As the electronic paper, a display device using a twisting ball display system can be used. In the twisting ball display system, spherical particles each colored in black and white are arranged between a first electrode and a second electrode which are electrodes used for a display element, and a potential difference is generated between the first electrode and the second electrode to control the orientation of the spherical particles, so that display is performed.

FIG. 12 illustrates active matrix electronic paper as one embodiment of a semiconductor device. The electronic paper in FIG. 12 is an example of a display device using a twisting ball display system.

Between the first electrode 4030 connected to the transistor 4010 and the second electrode 4031 provided on the second substrate 4006 side are provided spherical particles 4613 each including a black region 4615a, a white region 4615b, and a cavity 4612 which is filled with liquid around the black region 4615a and the white region 4615b. A space around the spherical particles 4613 is filled with a filler 4614 such as a resin. The second electrode 4031 corresponds to a common electrode (counter electrode). The second electrode 4031 is electrically connected to a common potential line.

Note that in FIG. 10, FIG. 11, and FIG. 12, a flexible substrate as well as a glass substrate can be used as the first substrate 4001 and the second substrate 4006. For example, a plastic substrate having a light-transmitting property can be used. As plastic, a fiberglass-reinforced plastics (FRP) plate, a poly(vinyl fluoride) (PVF) film, a polyester film, or an acrylic resin film can be used. In addition, a sheet with a structure in which an aluminum foil is interposed between PVF films or polyester films can be used.

In this embodiment, a silicon oxide film is used as the insulating layer 4020, and an aluminum oxide film is used as the insulating layer 4024. The insulating layer 4020 and the insulating layer 4024 can be formed by a sputtering method or a plasma CVD method. The insulating layer 4020 in contact with the amorphous oxide semiconductor layer preferably includes an oxygen-excess region.

The aluminum oxide film provided as the insulating layer 4024 over the amorphous oxide semiconductor layer has a high blocking effect and thus is less likely to transmit both oxygen and impurities such as hydrogen and moisture.

Accordingly, the aluminum oxide film functions as a protective film that prevents entry of impurities such as hydrogen and moisture, which can cause variation, into the amorphous oxide semiconductor layer and release of oxygen from the amorphous oxide semiconductor layer during and after the manufacturing process.

Each of the transistor 4010 and the transistor 4011 includes a highly purified amorphous oxide semiconductor layer in which an oxygen-excess region is provided for suppression of formation of an oxygen vacancy. In addition, the transistor 4010 and the transistor 4011 each include a silicon oxide film as a gate insulating layer. The amorphous oxide semiconductor layer included in each of the transistor 4010 and the transistor 4011 is obtained in such a manner that a region containing oxygen in a proportion higher than that in the stoichiometric composition is formed by oxygen implantation treatment, and thermal treatment is performed after the implantation in a state where the aluminum oxide film or a film including the aluminum oxide film is provided as the insulating layer 4024 over the amorphous oxide semiconductor layer; therefore, oxygen can be prevented from being released from the amorphous oxide semiconductor layer by the thermal treatment. Accordingly, the obtained amorphous oxide semiconductor layer can be a film which includes a region containing oxygen in a proportion higher than that in the stoichiometric composition.

The amorphous oxide semiconductor layer included in each of the transistor 4010 and the transistor 4011 is a highly purified film which is dehydrated or dehydrogenated and in which an oxygen vacancy is compensated. Accordingly, by using the amorphous oxide semiconductor layer for each of the transistor 4010 and the transistor 4011, it is possible to reduce variation in the threshold voltage $V_{th}$ of the transistors due to an oxygen vacancy and suppress a shift of the threshold voltage.

The insulating layer 4021 functioning as a planarizing insulating layer can be formed using an organic material having heat resistance, such as an acrylic resin, a polyimide, a benzocyclobutene-based resin, a polyamide, or an epoxy resin. Other than such organic materials, it is also possible to use a low-dielectric constant material (low-k material) such as a siloxane-based resin, phosphosilicate glass (PSG), or borophosphosilicate glass (BPSG). Note that the insulating layer 4021 may be formed by stacking a plurality of insulating layers formed using any of these materials.

There is no particular limitation on the method of forming the insulating layer 4021, and the following method can be used depending on the material: a sputtering method, an SOG method, spin coating, dipping, spray coating, a droplet discharge method (such as an inkjet method), screen printing, offset printing, or the like.

The first electrode 4030 and the second electrode 4031 can be formed, for example, using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or graphene.

Alternatively, the first electrode 4030 and the second electrode 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition including a conductive polymer can be used for the first electrode 4030 and the second electrode 4031. As the conductive polymer, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

A protective circuit for protecting the driver circuit may be provided. The protective circuit is preferably formed using a nonlinear element.

As described above, by using any of the transistors described in Embodiments 1 to 4, a semiconductor device having a variety of functions can be provided.

Embodiment 6

A semiconductor device having an image sensor function of reading information on an object can be manufactured using any of the transistors described in Embodiments 1 to 4.

Figure 13A:
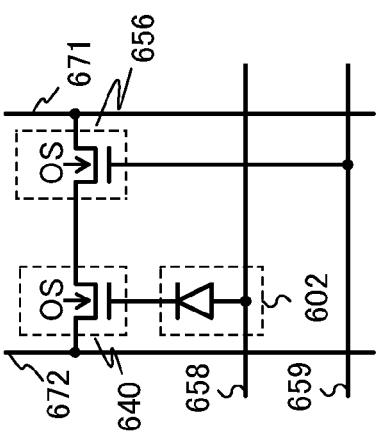
FIGS. 13A and 13B illustrate one embodiment of a semiconductor device.

FIG. 13A illustrates an example of a semiconductor device having an image sensor function. FIG. 13A is an equivalent circuit diagram of a photosensor, and FIG. 13B is a cross-sectional view illustrating part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain of the transistor 656 is electrically connected to a photosensor output signal line 671.

Note that in the circuit diagram in this specification, a transistor including an amorphous oxide semiconductor layer is denoted by a symbol "OS" so that it can be identified as a transistor formed using an amorphous oxide semiconductor layer. In FIG. 13A, the transistor 640 and the transistor 656 are each a transistor including an amorphous oxide semiconductor layer in which an oxygen-excess region is formed by oxygen implantation treatment, like the transistors described in Embodiments 1 to 4.

Figure 13B:
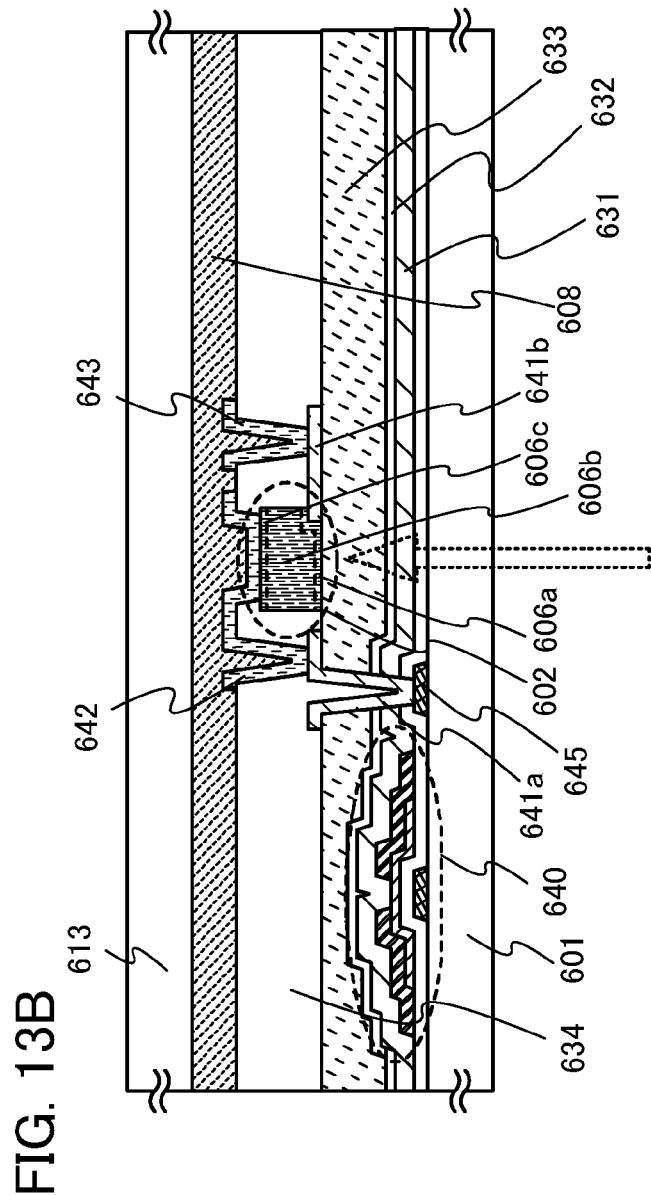

FIG. 13B is a cross-sectional view of the photodiode 602 and the transistor 640 in the photosensor. The photodiode 602 functioning as a sensor and the transistor 640 are provided over a substrate 601 (TFT substrate) having an insulating surface. A substrate 613 is provided over the photodiode 602 and the transistor 640 with the use of an adhesive layer 608.

An insulating layer 631, an insulating layer 632, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between electrodes 641a and 641b formed over the interlayer insulating film 633 and an electrode 642 formed over the interlayer insulating film 634.

The electrode 641b is electrically connected to a conductive layer 643 formed over the interlayer insulating film 634, and the electrode 642 is electrically connected to an electrode 645 through the electrode 641a. The electrode 645 is electrically connected to a gate electrode of the transistor 640, and thus the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The microcrystalline semiconductor belongs to a metastable state of an intermediate between amorphous and single crystalline when Gibbs free energy is considered. That is, the microcrystalline semiconductor is a semiconductor having a third state which is thermodynamically stable and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wavenumbers than 520 $cm^{-1}$, which represents a peak of the Raman spectrum of single crystal silicon. That is, the peak of the Raman spectrum of microcrystalline silicon exists between 520 $cm^1$ which represents single crystal silicon and 480 $cm^1$ which represents amorphous silicon. In addition, microcrystalline silicon contains at least 1 at. % or more of hydrogen or halogen in order to terminate a dangling bond. Moreover, microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a high-frequency plasma CVD method with a frequency of several tens of megahertz to several hundreds of megahertz or using a microwave plasma CVD apparatus with a frequency of 1 GHz or higher. The microcrystalline semiconductor film can be typically formed using a dilution of silicon hydride such as $SiH_4$, $Si_2H_6$, $SiH_2Cl_2$, or $SiHCl_3$ with hydrogen. With a dilution of a silicon hydride with one or plural kinds of rare gas elements selected from helium, argon, krypton, and neon in addition to hydrogen, the microcrystalline semiconductor film can be formed. In that case, the flow ratio of hydrogen to silicon hydride is greater than or equal to 5:1 and less than or equal to 200:1, preferably greater than or equal to 50:1 and less than or equal to 150:1, further preferably 100:1. Further, a hydrocarbon gas such as $CH_4$ or $C_2H_6$, a germanium gas such as $GeH_4$ or $GeF_4$, $F_2$, or the like may be mixed into the gas containing silicon.

The mobility of holes generated by the photoelectric effect is lower than the mobility of electrons. Therefore, a pin photodiode has better characteristics when a surface on the p-type semiconductor film side is used as a light-receiving plane. Here, an example in which light received by the photodiode 602 from a surface of the substrate 601, over which the pin photodiode is formed, is converted into electric signals is described. Light from the semiconductor film having a conductivity type opposite to that of the semiconductor film on the light-receiving plane is disturbance light; therefore, the electrode is preferably formed using a light-blocking conductive film. Note that the n-type semiconductor film side may alternatively be a light-receiving plane.

With the use of an insulating material, the insulating layer 632, the interlayer insulating film 633, and the interlayer insulating film 634 can be formed, depending on the material, using a method such as a sputtering method, a plasma CVD method, an SOG method, spin coating, dipping, spray coating, a droplet discharge method (such as an inkjet method), screen printing, or offset printing.

In this embodiment, an aluminum oxide film is used as the insulating layer 631. The insulating layer 631 can be formed by a sputtering method or a plasma CVD method.

The aluminum oxide film provided as the insulating layer 631 over the amorphous oxide semiconductor layer has a high blocking effect and thus is less likely to transmit both oxygen and impurities such as hydrogen and moisture.

Accordingly, the aluminum oxide film functions as a protective film that prevents entry of impurities such as hydrogen and moisture, which can cause variation, into the amorphous oxide semiconductor layer and release of oxygen from the amorphous oxide semiconductor layer during and after the manufacturing process.

In this embodiment, the transistor 640 includes a highly purified amorphous oxide semiconductor layer in which an oxygen-excess region is provided for suppression of formation of an oxygen vacancy. In addition, the transistor 640 includes a silicon oxide film as a gate insulating layer. The amorphous oxide semiconductor layer included in the transistor 640 is obtained in such a manner that a region containing oxygen in a proportion higher than that in the stoichiometric composition is formed by oxygen implantation treatment, and thermal treatment is performed after the implantation in a state where the aluminum oxide film is provided as the insulating layer 631 over the amorphous oxide semiconductor layer; therefore, oxygen can be prevented from being released from the amorphous oxide semiconductor layer by the thermal treatment. Accordingly, the obtained amorphous oxide semiconductor layer can be a film which includes a region containing oxygen in a proportion higher than that in the stoichiometric composition.

The amorphous oxide semiconductor layer included in the transistor 640 is a highly purified film which is dehydrated or dehydrogenated by thermal treatment performed after formation of the amorphous oxide semiconductor layer. Accordingly, by using the amorphous oxide semiconductor layer for the transistor 640, it is possible to reduce variation in the threshold voltage $V_{th}$ of the transistor due to an oxygen vacancy and suppress a shift of the threshold voltage.

The insulating layer 632 can be formed using an inorganic insulating material and can have a single-layer or stacked structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

For reduction of surface roughness, an insulating layer functioning as a planarizing insulating layer is preferably used as each of the interlayer insulating films 633 and 634. For the interlayer insulating films 633 and 634, for example, an organic insulating material having heat resistance, such as a polyimide, an acrylic resin, a benzocyclobutene-based resin, a polyamide, or an epoxy resin, can be used. Other than such organic insulating materials, it is possible to use a single layer or stacked layers of any of low-dielectric constant materials (low-k material) such as a siloxane-based resin, phosphosilicate glass (PSG), and borophosphosilicate glass (BPSG).

With detection of light that enters the photodiode 602, information on an object to be detected can be read. Note that a light source such as a backlight can be used at the time of reading information on an object to be detected.

As described above, a transistor which includes a highly purified amorphous oxide semiconductor layer containing excess oxygen that compensates an oxygen vacancy has less variation in electric characteristics and is electrically stable. Thus, by using the transistor, a highly reliable semiconductor device can be provided.

This embodiment can be implemented in appropriate combination with the structures described in the other embodiments.

Embodiment 7

A semiconductor device disclosed in this specification can be applied to a variety of electronic appliances (including a game machine). Examples of electronic appliances are a television device (also referred to as a television or a television receiver), a monitor of a computer or the like, a camera such as a digital camera or a digital video camera, a digital photo frame, a mobile phone (also referred to as a cellular phone or a mobile phone device), a portable game machine, a personal digital assistant, an audio reproducing device, and a large-sized game machine such as a pachinko machine. Examples of electronic appliances each including the semiconductor device described in any of the above embodiments will be described.

Figure 14A:
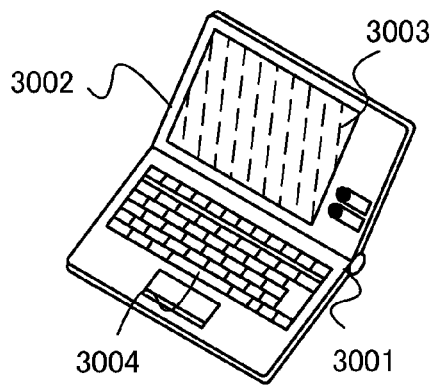
FIGS. 14A to 14F illustrate electronic appliances.

FIG. 14A illustrates a laptop personal computer which includes a main body 3001, a housing 3002, a display portion 3003, a keyboard 3004, and the like. The semiconductor device described in any of the above embodiments is applied to the display portion 3003, whereby the laptop personal computer can be highly reliable.

Figure 14B:
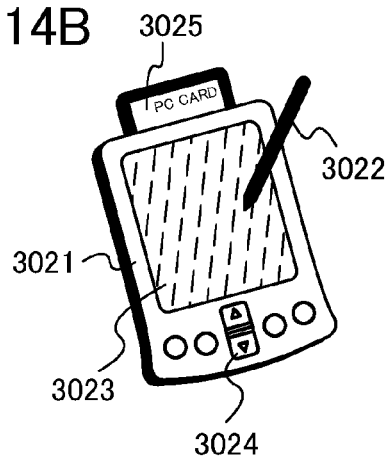

FIG. 14B illustrates a personal digital assistant (PDA) which includes a main body 3021 provided with a display portion 3023, an external interface 3025, an operation button 3024, and the like. A stylus 3022 is provided as an accessory for operation. The semiconductor device described in any of the above embodiments is applied to the display portion 3023, whereby the personal digital assistant (PDA) can be highly reliable.

Figure 14C:
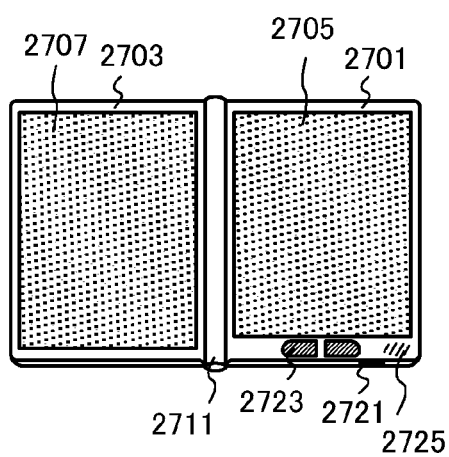

FIG. 14C illustrates an example of an e-book reader. For example, the e-book reader includes two housings, a housing 2701 and a housing 2703. The housing 2701 and the housing 2703 are combined with a hinge 2711 so that the e-book reader can be opened and closed using the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, text can be displayed on the right display portion (the display portion 2705 in FIG. 14C) and graphics can be displayed on the left display portion (the display portion 2707 in FIG. 14C). The semiconductor device described in any of the above embodiments is applied to the display portion 2705 and the display portion 2707, whereby the e-book reader can be highly reliable. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 14C illustrates an example in which the housing 2701 is provided with an operation portion and the like. For example, the housing 2701 is provided with a power switch 2721, an operation key 2723, and a speaker 2725. With the operation key 2723, pages can be turned. Note that a keyboard, a pointing device, or the like may also be provided on the surface of the housing, on which the display portion is provided. Further, an external connection terminal (such as an earphone terminal or a USB terminal), a recording medium insertion portion, or the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 14D:
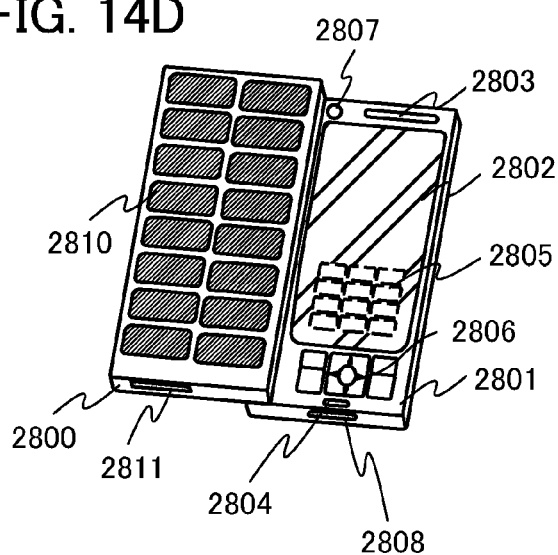

FIG. 14D illustrates a mobile phone which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The semiconductor device described in any of the above embodiments is applied to the display panel 2802, whereby the mobile phone can be highly reliable.

Further, the display panel 2802 is provided with a touch panel. A plurality of operation keys 2805 displayed as images is illustrated by dashed lines in FIG. 14D. Note that a boosting circuit by which voltage output from the solar cell 2810 is increased to be sufficiently high for each circuit is also provided.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 14D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charge and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 14E:
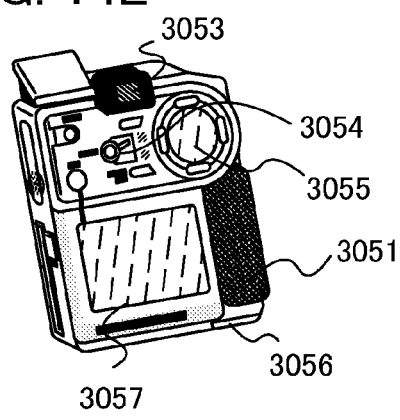

FIG. 14E illustrates a digital video camera which includes a main body 3051, a display portion A 3057, an eyepiece portion 3053, an operation switch 3054, a display portion B 3055, a battery 3056, and the like. The semiconductor device described in any of the above embodiments is applied to the display portion A 3057 and the display portion B 3055, whereby the digital video camera can be highly reliable.

Figure 14F:
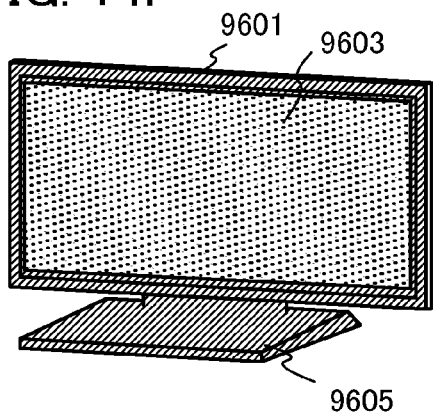

FIG. 14F illustrates an example of a television device. In the television device, a display portion 9603 is incorporated in a housing 9601. The display portion 9603 can display images. Here, the housing 9601 is supported by a stand 9605. The semiconductor device described in any of the above embodiments is applied to the display portion 9603, whereby the television device can be highly reliable.

The television device can be operated by an operation switch of the housing 9601 or a separate remote controller. Further, the remote controller may be provided with a display portion for displaying data output from the remote controller.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) data communication can be performed.

This embodiment can be implemented in appropriate combination with the structures described in the other embodiments.

Example 1

In this example, properties of an aluminum oxide film used as a barrier film in a semiconductor device according to one embodiment of the invention disclosed herein were evaluated. The results are shown in FIGS. 15A1, 15A2, 15B1, and 15B2, FIGS. 16A1, 16A2, 16B1, and 16B2, FIGS. 17A to 17D, and FIGS. 18A to 18D. As evaluation methods, secondary ion mass spectrometry (SIMS) and thermal desorption spectrometry (TDS) were used.

First, evaluation by SIMS analysis is described. As a comparative example, a comparative sample A was fabricated in such a manner that a silicon oxide film was formed to a thickness of 100 nm over a glass substrate by a sputtering method. An example sample A was fabricated in such a manner that a silicon oxide film was formed to a thickness of 100 nm over a glass substrate by a sputtering method, and an aluminum oxide film was formed to a thickness of 100 nm over the silicon oxide film by a sputtering method.

For each of the comparative sample A and the example sample A, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample A, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

The comparative sample A and the example sample A were each subjected to a pressure cooker test (PCT). In the PCT in this example, the comparative sample A and the example sample A were held for 100 hours under the following conditions: the temperature was 130° C., the humidity was 85%, the atmosphere was an atmosphere where $H_2O$ (water):$D_2O$ (heavy water)=3:1, and the atmospheric pressure was 2.3 atm (0.23 MPa).

As SIMS analysis, substrate side depth profile (SSDP) SIMS was used to measure concentrations of an H atom and a D (deuterium) atom in the comparative sample A and the example sample A before and after the PCT.

FIG. 15A1 shows H-atom and D-atom concentration profiles of the comparative sample A before the PCT, and FIG. 15A2 shows H-atom and D-atom concentration profiles of the comparative sample A after the PCT, which were obtained using SIMS analysis. In FIGS. 15A1 and 15A2, an expected D-atom concentration (D expected) profile is a calculated concentration profile of the D atom, which was obtained using the H-atom concentration profile on the assumption that the abundance ratio of the D atom thereto is 0.015%. Therefore, the amount of the D atom absorbed in the sample by the PCT equals the difference between the measured D-atom concentration (D profile) and the expected D-atom concentration (D expected). FIG. 15B1 shows a D-atom concentration profile before the PCT, which was obtained by subtracting the expected D-atom concentration from the measured D-atom concentration; FIG. 15B2 shows a D-atom concentration profile after the PCT, which was obtained by subtracting the expected D-atom concentration from the measured D-atom concentration.

In a similar manner, FIG. 16A1 shows H-atom and D-atom concentration profiles of the example sample A before the PCT, which was obtained by SIMS; FIG. 16A2 shows H-atom and D-atom concentration profiles of the example sample A after the PCT, which was obtained by SIMS. In addition, FIG. 16B1 shows a D-atom concentration profile before the PCT, which was obtained by subtracting the expected D-atom concentration from the measured D-atom concentration; FIG. 16B2 shows a D-atom concentration profile after the PCT, which was obtained by subtracting the expected D-atom concentration from the measured D-atom concentration.

Note that all the results of SIMS analysis in this example were quantified using a standard sample of a silicon oxide film.

As shown in FIGS. 15A1, 15A2, 15B1, and 15B2, while the measured D-atom concentration profile overlaps with the expected D-atom concentration profile before the PCT, the measured D-atom concentration greatly increases after the PCT; accordingly, it is found that the D atom was absorbed into the silicon oxide film. Therefore, it is confirmed that the silicon oxide film of the comparative sample has a low bather property with respect to moisture ($H_2O$ and $D_2O$) from the outside.

In contrast, as shown in FIGS. 16A1, 16A2, 16B1, and 16B2, as for the example sample A in which the aluminum oxide film was stacked over the silicon oxide film, it is found that only a slight amount of D atom entered a surface of the aluminum oxide film by the PCT and that the D atom entered neither the aluminum oxide film at a depth around 30 nm or greater nor the silicon oxide film. Therefore, it is confirmed that the aluminum oxide film has a high barrier property with respect to moisture ($H_2O$ and $D_2O$) from the outside.

The following shows evaluation by TDS analysis. As an example sample, an example sample B was fabricated in such a manner that a silicon oxide film was formed to a thickness of 100 nm over a glass substrate by a sputtering method, and an aluminum oxide film was formed to a thickness of 20 nm over the silicon oxide film by a sputtering method. Further, as a comparative example, a comparative sample B was fabricated in such a manner that after the example sample B was measured by TDS analysis, the aluminum oxide film thereof was removed, and only the silicon oxide film was left over the glass substrate.

For each of the comparative sample B and the example sample B, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample B, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

Other three types of the comparative sample B and the example sample B were fabricated by further performing thermal treatment at the respective temperatures of 300° C., 450° C., and 600° C. The thermal treatment was performed for 1 hour in a nitrogen atmosphere for each sample.

Figure 17A:
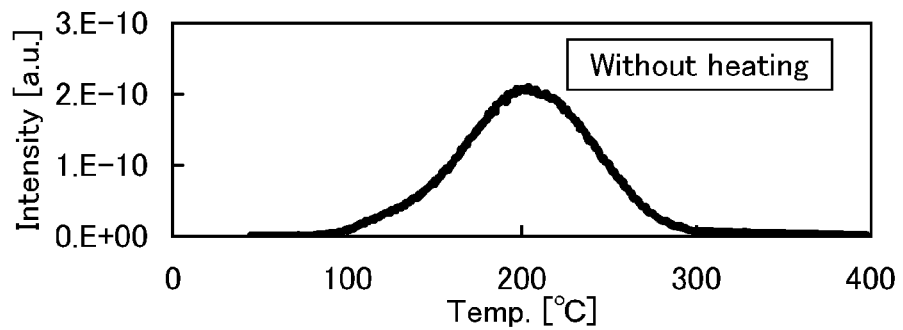
FIGS. 17A to 17D show results of TDS measurement performed on samples fabricated in Example 1.
Figure 17B:
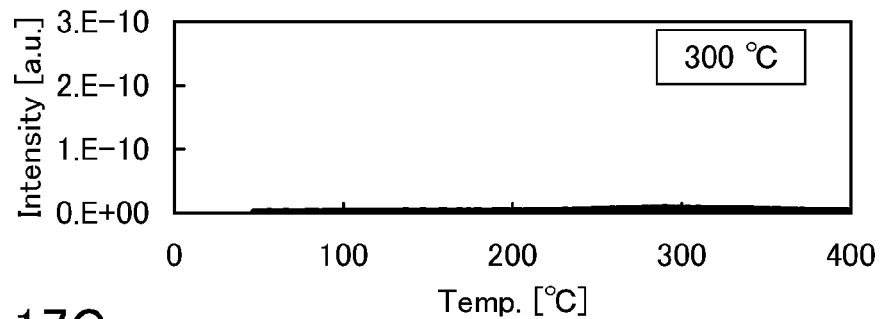
Figure 17C:
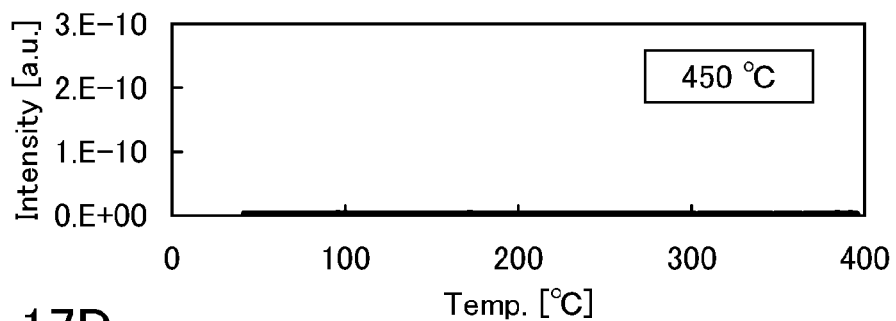
Figure 17D:
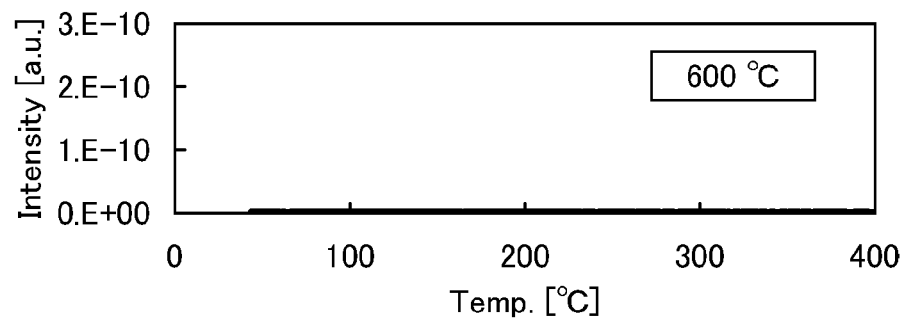
Figure 18A:
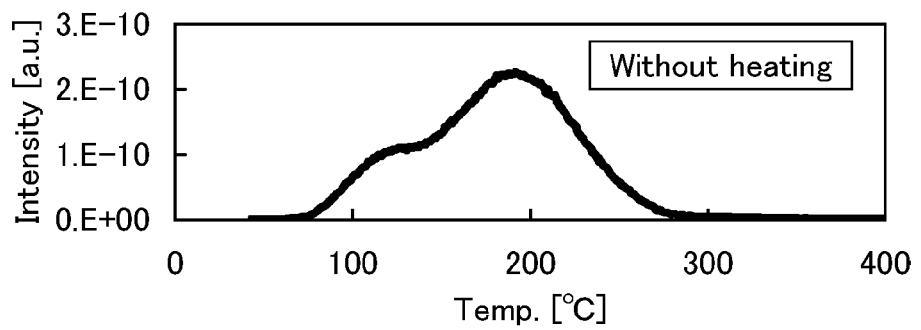
FIGS. 18A to 18D show results of TDS measurement performed on samples fabricated in Example 1.
Figure 18B:
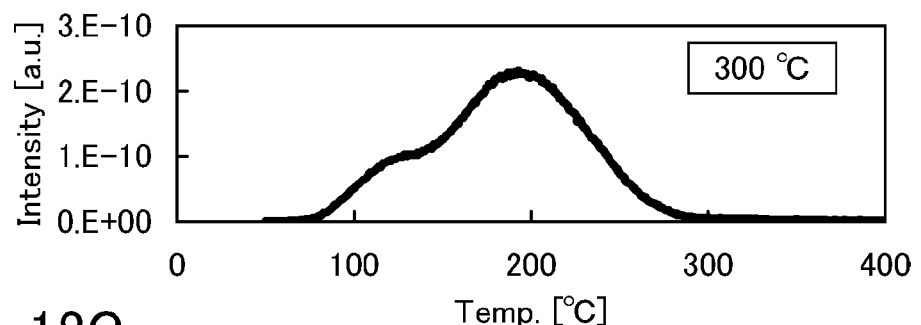
Figure 18C:
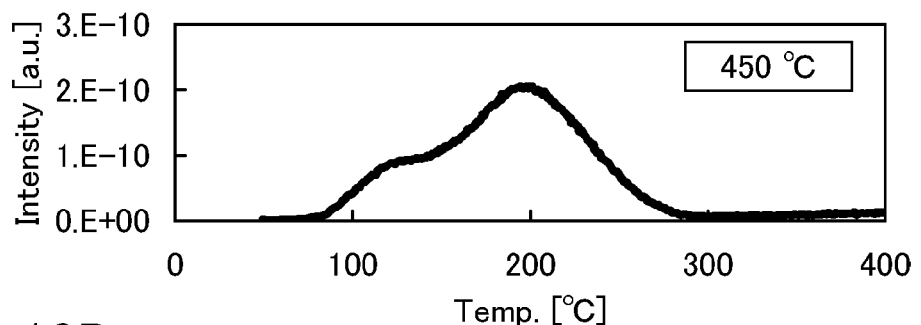
Figure 18D:
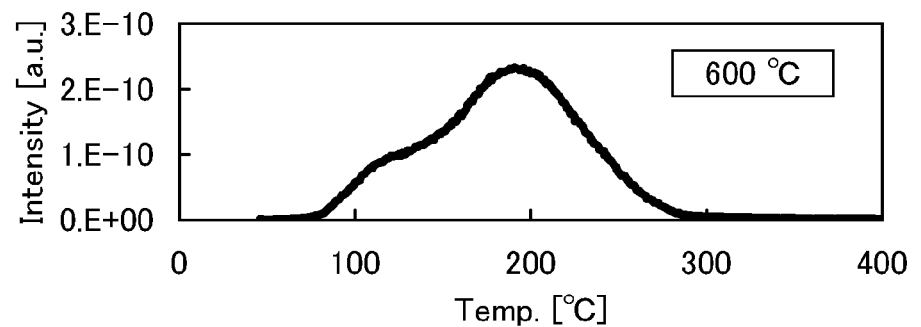

TDS analysis was performed on the four types of the comparative sample B and the four types of the example sample B fabricated under the respective four conditions (without thermal treatment, with 300° C. thermal treatment, with 450° C. thermal treatment, and with 600° C. thermal treatment). FIG. 17A shows a result of TDS analysis at M/z=32 ($O_2$) of the comparative sample B subjected to no thermal treatment, FIG. 17B shows that of the comparative sample B subjected to thermal treatment at 300° C., FIG. 17C shows that of the comparative sample B subjected to thermal treatment at 450° C., and FIG. 17D shows that of the comparative sample B subjected to thermal treatment at 600° C. FIG. 18A shows a result of TDS analysis at M/z=32 ($O_2$) of the example sample B subjected to no thermal treatment, FIG. 18B shows that of the example sample B subjected to thermal treatment at 300° C., FIG. 18C shows that of the example sample B subjected to thermal treatment at 450° C., and FIG. 18D shows that of the example sample B subjected to thermal treatment at 600° C.

As shown in FIGS. 17A to 17D, it can be seen in FIG. 17A that oxygen was released from the silicon oxide film of the comparative sample B which was not subjected to thermal treatment. However, the amount of oxygen released was greatly decreased in the comparative sample B subjected to the thermal treatment at 300° C. as shown in FIG. 17B. Furthermore, the amount of the released oxygen was smaller than or equal to a background level of TDS measurement in the case of comparative samples B subjected to the thermal treatment at 450° C. and 600° C. as shown in FIGS. 17C and 17D, respectively.

The results in FIGS. 17A to 17D indicate that 90% or more of excess oxygen contained in the silicon oxide film was released outside the silicon oxide film by the thermal treatment at 300° C. and that substantially all of the excess oxygen contained in the silicon oxide film was released outside the silicon oxide film by the thermal treatment at 450° C. and 600° C. Therefore, it is confirmed that the silicon oxide film has a low bather property with respect to oxygen.

In contrast, as shown in FIGS. 18A to 18D, substantially the same amount of oxygen was released from every type of the example sample B, in which the aluminum oxide film was formed over the silicon oxide film, regardless of whether the thermal treatment was not performed or was performed at 300° C., 450° C., and 600° C.

The results in FIGS. 18A to 18D indicate that when the aluminum oxide film was formed over the silicon oxide film, the excess oxygen contained in the silicon oxide film was not easily released to the outside by thermal treatment and the state where the excess oxygen was contained in the silicon oxide film was held to a considerable extent. Therefore, it is confirmed that the aluminum oxide film has a high barrier property with respect to oxygen.

The above results confirm that the aluminum oxide film has both a high barrier property with respect to hydrogen and moisture and a high barrier property with respect to oxygen, and functions suitably as a barrier film with respect to hydrogen, moisture, and oxygen.

Accordingly, the aluminum oxide film can function as a protective film that prevents entry of impurities such as hydrogen and moisture, which can cause variation, into an amorphous oxide semiconductor layer and release of oxygen from the amorphous oxide semiconductor layer during and after the manufacturing process of a transistor including the amorphous oxide semiconductor layer.

Therefore, the amorphous oxide semiconductor layer has high purity because impurities such as hydrogen and moisture do not enter the amorphous oxide semiconductor layer, and includes a region containing oxygen in a proportion higher than that in the stoichiometric composition of the amorphous oxide semiconductor layer in a crystalline state because oxygen is prevented from being released. Accordingly, by using the amorphous oxide semiconductor layer for a transistor, it is possible to reduce variation in the threshold voltage $V_{th}$ of the transistor due to an oxygen vacancy and suppress a shift of the threshold voltage.

Example 2

In this example, the crystalline state of an oxide semiconductor layer was observed.

An example sample C1 was fabricated as a sample as follows: a 300-nm-thick silicon oxide film was formed over a glass substrate by a sputtering method, a 100-nm-thick In—Ga—Zn—O film was formed over the silicon oxide film by a sputtering method, and a 100-nm-thick aluminum oxide film was formed over the In—Ga—Zn—O film by a sputtering method.

The silicon oxide film was formed under the following conditions: a silicon oxide ($SiO_2$) target was used as a target, the distance between the glass substrate and the target was 60 mm, the pressure was 0.4 Pa, the power of the RF power source was 1.5 kW, the atmosphere was a mixed atmosphere containing argon and oxygen (the argon flow rate was 25 sccm and the oxygen flow rate was 25 sccm), and the substrate temperature was 100° C.

The film formation conditions of the In—Ga—Zn—O film were as follows: the target was an oxide target having a composition ratio of $In_2O_3:Ga_2O_3:ZnO=1:1:2$ [molar ratio], the distance between the glass substrate and the target was 60 mm, the pressure was 0.4 Pa, the power of the RF power source was 0.5 kW, the atmosphere was a mixed atmosphere containing argon and oxygen (the argon flow rate was 30 sccm and the oxygen flow rate was 15 sccm), and the substrate temperature was 250° C.

Note that the silicon oxide film and the In—Ga—Zn—O film were successively formed without exposure to the air, and then thermal treatment (first thermal treatment) was performed thereon at 400° C. for 30 minutes in a reduced pressure atmosphere.

Then, the aluminum oxide film was formed under the following conditions: an aluminum oxide ($Al_2O_3$) target was used as a target, the distance between the glass substrate and the target was 60 mm, the pressure was 0.4 Pa, the power of the RF power source was 2.5 kW, the atmosphere was a mixed atmosphere containing argon and oxygen (the argon flow rate was 25 sccm and the oxygen flow rate was 25 sccm), and the substrate temperature was 250° C.

Next, an example sample C2 was fabricated by implanting oxygen into the In—Ga—Zn—O film through the aluminum oxide film of the example sample C1. In the example sample C2, an oxygen ($^{18}O$) ion was implanted into the In—Ga—Zn—O film through the aluminum oxide film by an ion implantation method. The oxygen ($^{18}O$) ion was implanted under conditions of an acceleration voltage of 80 kV and a dose of $1.0\times10^{16}$ ions/cm$^2$.

Further, an example sample C3 was fabricated by performing thermal treatment (second thermal treatment) on the example sample C2 at 450° C. for 1 hour in a nitrogen atmosphere.

Figure 19A:
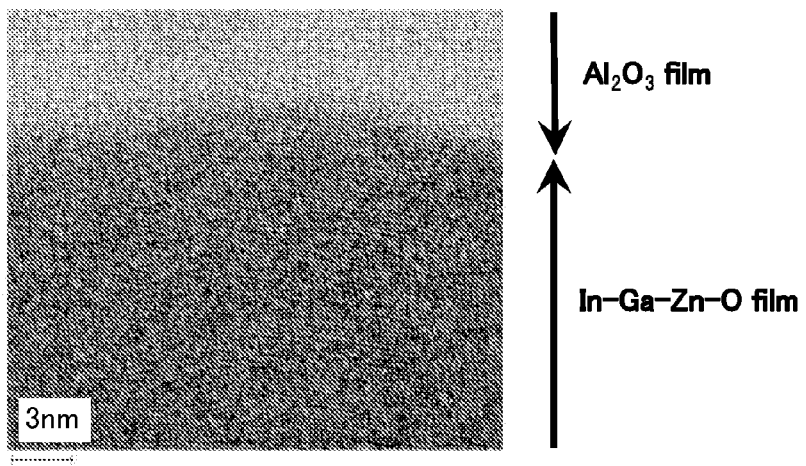
FIGS. 19A to 19C are TEM images of samples fabricated in Example 2.
Figure 19B:
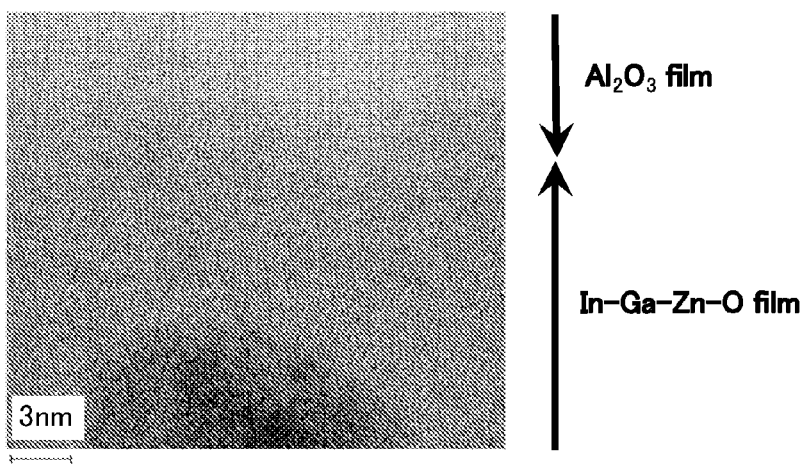
Figure 19C:
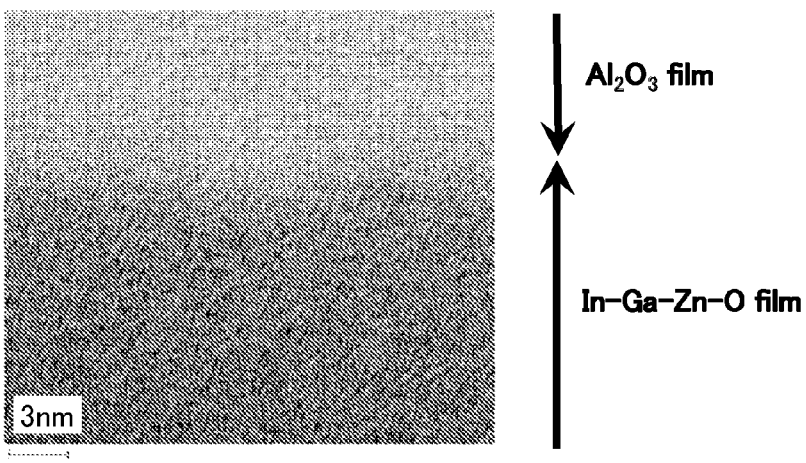

End planes were cut out from the example samples C1 to C3 obtained through the above steps, and cross sections of the In—Ga—Zn—O films thereof were observed with a high resolution transmission electron microscope (TEM) ("H9000-NAR" manufactured by Hitachi High-Technologies Corporation) at an acceleration voltage of 300 kV. FIGS. 19A to 19C are TEM images of the example samples C1 to C3, respectively.

FIG. 19A is a TEM image at 8 million-fold magnification of the interface between the In—Ga—Zn—O film and the aluminum oxide film of the example sample C1. FIG. 19B is a TEM image at 8 million-fold magnification of the interface between the In—Ga—Zn—O film and the aluminum oxide film of the example sample C2. FIG. 19C is a TEM image at 8 million-fold magnification of the interface between the In—Ga—Zn—O film and the aluminum oxide film of the example sample C3.

A lattice image can be observed in the In—Ga—Zn—O film in FIG. 19A, which indicates that the example sample C1 includes a crystalline region.

In contrast, a lattice image, which is seen in FIG. 19A, is not observed in the In—Ga—Zn—O film in FIG. 19B that was subjected to the oxygen implantation treatment.

As in the case of FIG. 19B, a lattice image is not observed in the In—Ga—Zn—O film in FIG. 19C that was subjected to the oxygen implantation treatment and the thermal treatment at 450° C. This result indicates that the In—Ga—Zn—O film of the example sample C3 is amorphous.

The following can be confirmed from the above results: oxygen implantation on an oxide semiconductor layer including a crystalline region transforms the crystalline region into an amorphous state, and subsequent thermal treatment at a temperature lower than or equal to 450° C. allows the amorphous state to be maintained.

This application is based on Japanese Patent Application serial no. 2011-103592 filed with the Japan Patent Office on May 6, 2011, the entire contents of which are hereby incorporated by reference.

What is claimed is:

1. A method for manufacturing a transistor, the method comprising the steps of:
    forming an amorphous oxide semiconductor layer;
    heating the amorphous oxide semiconductor layer to form a crystalline region in the amorphous oxide semiconductor layer;
    forming a gate insulating layer over and in contact with the heated amorphous oxide semiconductor layer;
    implanting oxygen to the amorphous oxide semiconductor layer so that the amorphous oxide semiconductor layer comprises a region having stoichiometrically excessive oxygen and the crystalline region is transformed to an amorphous structure;
    forming a gate electrode over the gate insulating layer; and
    forming an insulating layer over the gate electrode, the insulating layer comprising aluminum oxide.

2. The method according to claim 1, wherein the implantation of oxygen is performed before forming the gate insulating layer.

3. The method according to claim 1, wherein the gate insulating layer comprises a region having stoichiometrically excessive oxygen.

4. The method according to claim 1, further comprising a heating step of the amorphous oxide semiconductor layer after forming the insulating layer so as to maintain the amorphous structure.

5. The method according to claim 1,
    wherein the insulating layer comprises a first layer and a second layer over the first layer,
    wherein the second layer comprises aluminum oxide, and
    wherein the first layer comprises a metal oxide other than aluminum oxide.

6. The method according to claim 5, wherein the first layer comprises a region having stoichiometrically excessive oxygen.

7. A method for manufacturing a transistor, the method comprising the steps of:
    forming a gate electrode over a substrate;
    forming a gate insulating layer over the gate electrode;
    forming an amorphous oxide semiconductor layer over the gate insulating layer;
    heating the amorphous oxide semiconductor layer to form a crystalline region in the amorphous oxide semiconductor layer;
    implanting oxygen to the heated amorphous oxide semiconductor layer so that the amorphous oxide semiconductor layer comprises a region having stoichiometrically excessive oxygen and the crystalline region is transformed to an amorphous structure; and forming an insulating layer over the amorphous oxide semiconductor layer, the insulating layer comprising aluminum oxide.

8. The method according to claim 7, wherein the implantation of oxygen is performed after forming the insulating layer.

9. The method according to claim 7, wherein the gate insulating layer comprises a region having stoichiometrically excessive oxygen.

10. The method according to claim 7,
wherein the insulating layer comprises a first layer and a second layer over the first layer,
wherein the second layer comprises aluminum oxide, and
wherein the first layer comprises a metal oxide other than aluminum oxide.

11. The method according to claim 10, wherein the first layer comprises a region having stoichiometrically excessive oxygen.

* * * * *